United States Patent
Cooper

(10) Patent No.: US 6,307,488 B1
(45) Date of Patent: Oct. 23, 2001

(54) LZW DATA COMPRESSION AND DECOMPRESSION APPARATUS AND METHOD USING GROUPED DATA CHARACTERS TO REDUCE DICTIONARY ACCESSES

(75) Inventor: Albert B. Cooper, New York, NY (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/564,956

(22) Filed: May 4, 2000

(51) Int. Cl.[7] .................................................. H03M 7/34

(52) U.S. Cl. ................................................ 341/51; 341/63

(58) Field of Search ................................ 341/50, 51, 63, 341/65, 67

(56) References Cited

U.S. PATENT DOCUMENTS

| | | | |
|---|---|---|---|
| 4,558,302 | 12/1985 | Welch | 340/347 |
| 5,463,390 | * 10/1995 | Whitting et al. | 341/51 |
| 5,764,167 | * 6/1998 | Adams et al. | 341/63 |
| 5,861,827 | * 1/1999 | Welch et al. | 341/51 |
| 6,169,499 | * 1/2001 | Cooper | 341/51 |
| 6,188,333 | * 2/2001 | Cooper | 341/51 |

OTHER PUBLICATIONS

Graphics Interchange Format (sm), Version 89a, Jul. 31, 1990.

TIFF Revision 6.0 Final—Jun. 3, 1992.

* cited by examiner

Primary Examiner—Peguy JeanPierre
(74) Attorney, Agent, or Firm—Albert B. Cooper; Mark T. Starr

(57) ABSTRACT

In a data compressor, the input stream of data characters is formed into one or more data character groupings where each grouping comprises a predetermined number of the data characters (grouped character) followed by one or more of the input data characters. The formed input is compared to similarly configured stored strings until a longest match is determined. Each stored string has a code associated therewith and the code of the longest match is output by the compressor. An extended string is stored comprising the longest match extended by the data character that caused the mismatch. A next compression cycle begins with a grouped character comprising the data character that caused the mismatch concatenated by one less than the predetermined number of the next following data characters. In one embodiment, data character strings comprise an initial grouped character followed by as many data characters as can be matched. In another embodiment, a string is comprised of consecutive grouped characters followed by one or more data characters up to a maximum of one less than the predetermined number. In this embodiment, when extension of a string for storage would result in the predetermined number of data characters following the consecutive grouped characters, the predetermined number of data characters is appended to the consecutive grouped characters as a further grouped character. In this embodiment two dictionaries are utilized, one for storing strings of consecutive grouped characters and the other for storing data character extensions of strings stored in the first dictionary.

62 Claims, 22 Drawing Sheets

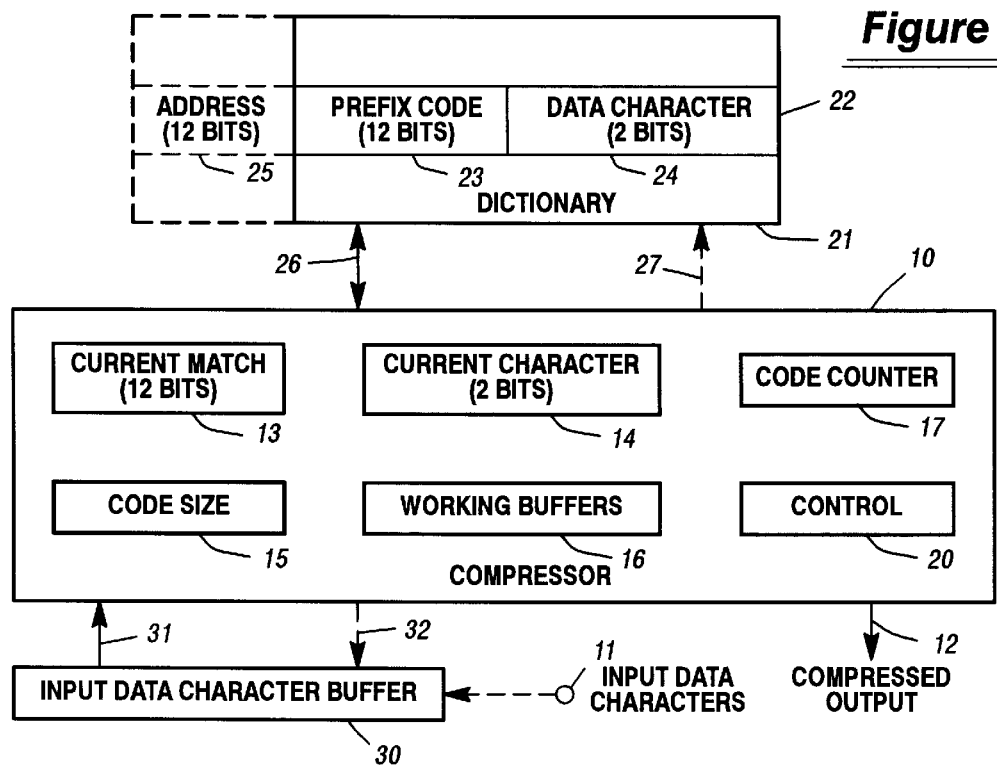
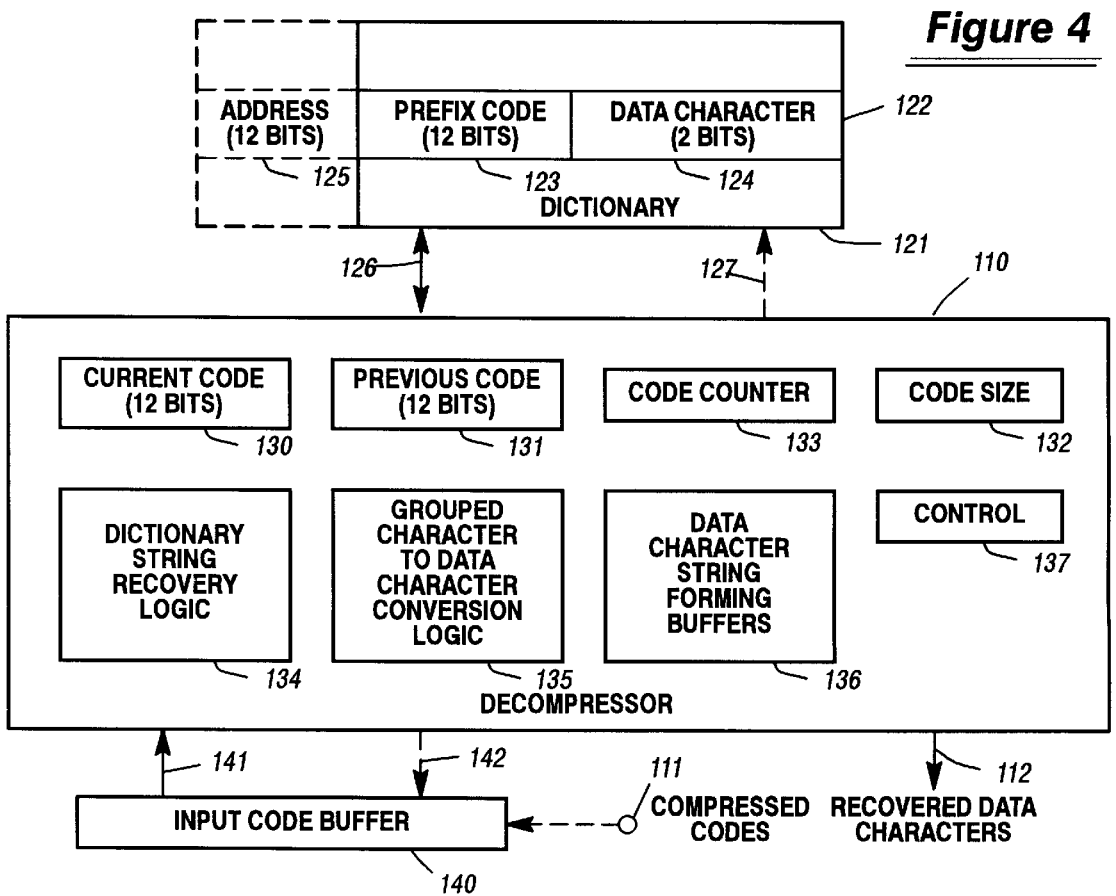

INPUT DATA CHARACTER STREAM $a_1\ b_1\ c_1\ a_2\ b_2\ c_2\ a_3\ b_3\ c_3\ a_4\ b_4\ c_4\ a_5\ b_5\ c_5\ \ldots\ a_{17}\ b_{17}\ c_{17}\ a_{18}\ b_{18}\ c_{18}$

| ACTIONS | CURRENT MATCH | CURR CHAR | CODE CNTR | DICT CODE | DICT CHAR | OUTPUT | BLOCKS OF FIG. 2 |
|---|---|---|---|---|---|---|---|
| 1 | $a_1b_1c_1a_2$ | $b_2$ | 258 | $a_1b_1c_1a_2$ | $b_2$ | $a_1b_1c_1a_2$ | 40-45,47,50 |
| 2 | $b_2c_2a_3b_3$ | $c_3$ | 259 | $b_2c_2a_3b_3$ | $c_3$ | $b_2c_2a_3b_3$ | 51-56,44,45,47,50 |
| 3 | $c_3a_4b_4c_4$ | $a_5$ | 260 | $c_3a_4b_4c_4$ | $a_5$ | $c_3a_4b_4c_4$ | 51-56,44,45,47,50 |
| 4 | $a_5b_5c_5a_6$ | $b_6$ | 261 | | | | 51-56,44,45 |
| 5 | 258 | $c_6$ | | 258 | $c_6$ | 258 | 44-47,50 |
| 6 | $c_6a_7b_7c_7$ | $a_8$ | 262 | | | | 51-56,44,45 |
| 7 | 260 | $b_8$ | | 260 | $b_8$ | 260 | 44-47,50 |
| 8 | $b_8c_8a_9b_9$ | $c_9$ | 263 | | | | 51-56,44,45 |
| 9 | 259 | $a_{10}$ | | 259 | $a_{10}$ | 259 | 44-47,50 |
| 10 | $a_{10}b_{10}c_{10}a_{11}$ | $b_{11}$ | 264 | | | | 51-56,44,45 |
| 11 | 258 | $c_{11}$ | | | | | 44-46 |
| 12 | 261 | $a_{12}$ | | 261 | $a_{12}$ | 261 | 44-47,50 |
| 13 | $a_{12}b_{12}c_{12}a_{13}$ | $b_{13}$ | 265 | | | | 51-56,44,45 |
| 14 | 258 | $c_{13}$ | | | | | 44-46 |
| 15 | 261 | $a_{14}$ | | | | | 44-46 |
| 16 | 264 | $b_{14}$ | | 264 | $b_{14}$ | 264 | 44-47,50 |
| 17 | $b_{14}c_{14}a_{15}b_{15}$ | $c_{15}$ | 266 | | | | 51-56,44,45 |
| 18 | 259 | $a_{16}$ | | | | | 44-46 |
| 19 | 263 | $b_{16}$ | | 263 | $b_{16}$ | 263 | 44-47,50 |
| 20 | $b_{16}c_{16}a_{17}b_{17}$ | $c_{17}$ | 267 | | | | 51-56,44,45 |
| 21 | 259 | $a_{18}$ | | | | | 44-46 |
| 22 | 263 | $b_{18}$ | | | | | 44-46 |
| 23 | 266 | $c_{18}$ | | 266 | $c_{18}$ | 266 | 44-47,50 |
| 24 | $c_{18}\ldots$ | | 268 | | | | 51-53 |

*Figure 3*

INPUT COMPRESSED CODE STREAM $a_1\ b_1\ c_1\ a_2\ b_2\ c_2\ a_3\ b_3\ c_3\ a_4\ b_4\ c_4\ 258\ 260\ 259\ 261\ 264\ 263\ 266$

| ACTIONS | CURRENT CODE | PREVIOUS CODE | CODE CNTR | DICT CODE | DICT CHAR | OUTPUT | BLOCKS OF FIG. 5-7 |
|---|---|---|---|---|---|---|---|
| 1 | $a_1b_1c_1a_2$ | | 258 | | | $a_1b_1c_1a_2$ | 150-154 |
| 2 | $b_2c_2a_3b_3$ | $a_1b_1c_1a_2$ | 259 | $a_1b_1c_1a_2$ | $b_2$ | $b_2c_2a_3b_3$ | 155-157,160,161 |
| 3 | $c_3a_4b_4c_4$ | $b_2c_2a_3b_3$ | 260 | $b_2c_2a_3b_3$ | $c_3$ | $c_3a_4b_4c_4$ | 162-165,156,157,160,161 |
| 4 | 258 | $c_3a_4b_4c_4$ | 261 | $c_3a_4b_4c_4$ | $a_1$ | $a_1b_1c_1a_2$ | 162-165,156,166,180-183 |
| 5 | 260 | 258 | 262 | 258 | $c_3$ | $c_3a_4b_4c_4a_1$ | 162-165,156,166,180-183 |
| 6 | 259 | 260 | 263 | 260 | $b_2$ | $b_2c_2a_3b_3c_3$ | 162-165,156,166,180-183 |
| 7 | 261 | 259 | 264 | 259 | $a_1$ | $a_1b_1c_1a_2b_2c_3$ | 162-165,156,166,180-183 |
| 8 | 264 | 261 | 265 | 261 | $a_1$ | $a_1b_1c_1a_2b_2c_3a_1$ | 162-165,156,166,190,194-197 |
| 9 | 263 | 264 | 266 | 264 | $b_2$ | $b_2c_2a_3b_3c_3a_1$ | 162-165,156,166,180-183 |
| 10 | 266 | 263 | 267 | 263 | $b_2$ | $b_2c_2a_3b_3c_3a_1b_2$ | 162-165,156,166,190,194-197 |
| 11 | ... | 266 | | | | | 162-165 |

*Figure 8*

INPUT DATA CHARACTER STREAM
$a_1\ b_1\ a_2\ b_2\ a_3\ b_3\ a_4\ b_4\ \ldots\ a_{55}\ b_{55}\ a_{56}\ b_{56}\ a_{57}$

| ACTIONS | CURRENT MATCH | CURRENT CHARACTER | CODE CNTR | DICT 1 CODE | DICT 1 CHARACTER | DICT 2 CODE | DICT 2 CHAR | CURRENT MATCH TEMP | n | OUTPUT | BLOCKS FIG. 10 |
|---|---|---|---|---|---|---|---|---|---|---|---|
| 1 | $a_1b_1a_2b_2$ | $a_3b_3a_4b_4$ | 258 | | | $a_1b_1a_2b_2$ | $a_3$ | $a_1b_1a_2b_2$ | 1 | $a_1b_1a_2b_2$ | 260-265,267-269,272,280,281 |
| 2 | $a_3b_3a_4b_4$ | $a_5b_5a_6b_6$ | 259 | | | | $b_5$ | $a_3b_3a_4b_4$ | 1 | | 282-287,264,265,267-269,272 |
| 3 | 258 | | | | | 258 | | | 2 | 258 | 272-275,280,281 |
| 4 | $b_5a_6b_6a_7$ | $b_7a_8b_8a_9$ | 260 | | | $b_5a_6b_6a_7$ | $b_7$ | $b_5a_6b_6a_7$ | 1 | $b_5a_6b_6a_7$ | 282-286,288,289,264,265,267-269, 272,280,281 |
| 5 | $b_7a_8b_8a_9$ | $b_9a_{10}b_{10}a_{11}$ | 261 | | | | | $b_7a_8b_8a_9$ | 1 | | 282-287,264,265,267-269,272 |
| 6 | 260 | | | | | 260 | $a_{10}$ | | 2 | 260 | 272-275,280,281 |
| 7 | $a_{10}b_{10}a_{11}b_{11}$ | $a_{12}b_{12}a_{13}b_{13}$ | 262 | | | | | $a_{10}b_{10}a_{11}b_{11}$ | 1 | | 282-286,288,289,264,265,267-269,272 |
| 8 | 258 | | | | | | | | 2 | | 272-275 |
| 9 | 259 | | | | | 259 | $a_{13}$ | | 3 | 259 | 272-275,280,281 |
| 10 | $a_{13}b_{13}a_{14}b_{14}$ | $a_{15}b_{15}a_{16}b_{16}$ | 263 | | | | | $a_{13}b_{13}a_{14}b_{14}$ | 1 | | 282-286,288,289,264,265,267-269,272 |
| 11 | 258 | | | | | | | | 2 | | 272-275 |
| 12 | 259 | | | | | | | | 3 | | 272-275 |
| 13 | 262 | | | | $a_{13}b_{13}a_{14}b_{14}$ | | | | 4 | 262 | 272-275,280,281 |
| 14 | $b_{16}a_{17}b_{17}a_{18}$ | $b_{18}a_{19}b_{19}a_{20}$ | 264 | | $a_{15}b_{15}a_{16}b_{16}$ | | | $b_{16}a_{17}b_{17}a_{18}$ | 1 | | 302-307,264,265,267-269,272 |
| 15 | 260 | | | | | | | | 2 | | 272-275 |
| 16 | 261 | | | | | 261 | $b_{19}$ | | 3 | 261 | 272-275,280,281 |

*Figure 11A*

| # | | | | | | | | | | |
|---|---|---|---|---|---|---|---|---|---|---|
| 17 | $b_{19}a_{20}b_{20}a_{21}$ | $b_{21}a_{22}b_{22}a_{23}$ | 265 | | | | | | $b_{19}a_{20}b_{20}a_{21}$ | 1 | 282-286,288,289,264,265, 267-269,272 |
| 18 | 260 | | | | | | | | | 2 | 272-275 |
| 19 | 261 | | | | | | | | | 3 | 272-275 |
| 20 | 264 | | | $b_{19}a_{20}b_{20}a_{21}$ | | | | | | 4 | 272-275,300,301 |
| 21 | $a_{23}b_{23}a_{24}b_{24}$ | | 266 | | $b_{21}a_{22}b_{22}a_{23}$ | | | | | | 302-307,264,265 |
| 22 | $a_{25}b_{25}a_{26}b_{26}$ | | | | | 263 | $a_{27}$ | 263 | | 1 | 264-269,272,280,281 |
| 23 | $a_{27}b_{27}a_{28}b_{28}$ | 263 | 267 | | | | | | 263 | 1 | 282-287,264,265 |
| 24 | $a_{29}b_{29}a_{30}b_{30}$ | 263 | | | | 266 | $b_{31}$ | | | 2 | 264-269,272 |
| 25 | $a_{31}b_{31}a_{32}b_{32}$ | 266 | | | | | | | | | 272-275,280,281 |
| 26 | $b_{31}a_{32}b_{32}a_{33}$ | | 268 | | | 265 | $b_{35}$ | 265 | | 1 | 282-286,288,289,264,265 |
| 27 | $b_{33}a_{34}b_{34}a_{35}$ | 265 | | | | | | | 265 | | 264-269,272,280,281 |
| 28 | $b_{35}a_{36}b_{36}a_{37}$ | | 269 | | | 268 | $a_{40}$ | | | 1 | 282-287,264,265 |
| 29 | $b_{37}a_{38}b_{38}a_{39}$ | 265 | | | | | | 265 | | 1 | 264-269,272 |
| 30 | $b_{39}a_{40}b_{40}a_{41}$ | 268 | | | | | | | | 2 | 272-275,280,281 |
| 31 | $a_{40}b_{40}a_{41}b_{41}$ | | 270 | | | 267 | $a_{45}$ | 263 | | | 282-286,288,289,264,265 |
| 32 | $a_{42}b_{42}a_{43}b_{43}$ | 263 | | | | | | | | 1 | 264-269,272 |
| 33 | $a_{44}b_{44}a_{45}b_{45}$ | 266 | | | | | | | | 2 | 272-275 |
| 34 | | 267 | | | | | | | | 3 | 272-275,280,281 |
| 35 | $a_{45}b_{45}a_{46}b_{46}$ | $a_{47}b_{47}a_{48}b_{48}$ | 271 | | | | | | | | 282-286,288,289,264,265 |

*Figure 11B*

| | | | | | | | | |
|---|---|---|---|---|---|---|---|---|
| 36 | 263 | $a_{49}b_{49}a_{50}b_{50}$ | | | | | 1 | 264-269,272 |
| 37 | 266 | | | | | | 2 | 272-275 |
| 38 | 267 | | | | | | 3 | 272-275 |
| 39 | 270 | | 263 | | | 263 | 4 | 272-275,300,301 |
| 40 | $b_{50}a_{51}b_{51}a_{52}$ | 272 | | $a_{49}b_{49}a_{50}b_{50}$ | | | | 302-307,264,265 |
| 41 | 265 | $b_{52}a_{53}b_{53}a_{54}$ | | | | 265 | 1 | 264-269,272 |
| 42 | 268 | $b_{54}a_{55}b_{55}a_{56}$ | | | | | 2 | 272-275 |
| 43 | 269 | | | | 269 | | 3 | 272-275,280,281 |
| 44 | $b_{55}a_{56}b_{56}a_{57}$ | ... | 273 | | | | | 282-286,288,289 |

| |
|---|
| *Fig. 11A* |
| *Fig. 11B* |
| *Fig. 11C* |

INPUT COMPRESSED CODE STREAM
$a_1b_1a_2b_2$ 258 $b_5a_6b_6a_7$ 260 259 262 261 264 263 266 265 268 267 270 269

| ACT-ION | CURRENT CODE | PREVIOUS CODE | CODE CNTR | DICT 1 CODE | DICT 1 CHAR | EXTENSION CHAR | DICT 2 CODE | DICT 2 CHAR | DICT TABLE | n | FLAG | FLAG TEMP | OUTPUT | BLOCKS OF FIG. 13-19 |
|---|---|---|---|---|---|---|---|---|---|---|---|---|---|---|
| 1 | $a_1b_1a_2b_2$ | | 258 | | | | | | | | 2 | | $a_1b_1a_2b_2$ | 400-405 |
| 2 | 258 | $a_1b_1a_2b_2$ | | | | | $a_1b_1a_2b_2$ | $a_1$ | | | | 2 | $a_1b_1a_2b_2a_1$ | 406,407,412,420,500-503 |
| 3 | $b_5a_6b_6a_7$ | 258 | 259 | | | | 258 | $b_5$ | | | 2 | 2 | $b_5a_6b_6a_7$ | 430-434,407,410,440-443 |
| 4 | 260 | $b_5a_6b_6a_7$ | 260 | | | | $b_5a_6b_6a_7$ | $b_5$ | | | 2 | 2 | $b_5a_6b_6a_7b_5$ | 430-434,407,412,420,500-503 |
| 5 | 259 | 260 | 261 | | | | 260 | $a_1$ | | 2 | 2 | 2 | $a_1b_1a_2b_2a_1b_5$ | 430-434,407,412,413,470,471,473-476,483,484 |
| 6 | 262 | 259 | 262 | | | | 259 | $a_1$ | | 2 | 2 | 1 | $a_1b_1a_2b_2a_1b_5$ $a_1$ | 430-434,407,412,422,520-522,524-526,533,534 |
| 7 | 261 | 262 | 263 | $a_1b_1a_2b_2$ | $a_1b_5a_1b_5$ | | | | 263 | 2 | 1 | 2 | $b_5a_6b_6a_7$ $b_5a_1$ | 430-434,407,412,413,470,471,473-476,483,485,488 |
| 8 | 264 | 261 | 264 | | | | 261 | $b_5$ | | 2 | 2 | 1 | $b_5a_6b_6a_7$ $b_5a_1b_5$ | 430-434,407,412,422,520-522,524-526,533,534 |
| 9 | 263 | 264 | 265 | $b_5a_6b_6a_7$ | $b_5a_1b_5a_1$ | | | | 265 | | 1 | 2 | $a_1b_1a_2b_2$ $a_1b_5a_1b_5$ | 430-434,407,412,413,450-454,456-459 |
| 10 | 266 | 263 | 266 | | | | 263 | $a_1$ | | | 2 | 2 | $a_1b_1a_2b_2a_1$ $b_5a_1b_5a_1$ | 430-434,407,412,422,510-514 |
| 11 | 265 | 266 | 267 | | | | 266 | $b_5$ | | | 2 | 2 | $b_5a_6b_6a_7$ $b_5a_1b_5a_1$ | 430-434,407,412,413,450-455 |
| 12 | 268 | 265 | 268 | | | | 265 | $b_5$ | | | 2 | 2 | $b_5a_6b_6a_7b_5a_1$ $b_5a_1b_5$ | 430-434,407,412,422,510-514 |

*Figure 20A*

| 13 | 267 | 268 | 269 | | | 268 | $a_1$ | | 2 | 2 | 2 | $a_1b_1a_2b_2a_1b_5$ $a_1b_5a_1b_5$ | 430–434,407,412,413,470, 471,473,474,480–484 |
| --- | --- | --- | --- | --- | --- | --- | --- | --- | --- | --- | --- | --- | --- |
| 14 | 270 | 267 | 270 | | | 267 | $a_1$ | | 2 | 2 | 2 | $a_1b_1a_2b_2a_1b_5$ $a_1b_5a_1b_5a_1$ | 430–434,407,412,422, 520–522,524,530–534 |
| 15 | 269 | 270 | 271 | 263 | $a_1b_5a_1b_5$ | | | 271 | 2 | 1 | 1 | $b_5a_6b_6a_7b_5a_1$ $b_5a_1b_5a_1$ | 430–434,407,412,413,470, 471,473,474,480–483, 485–488 |
| 16 | ... | 269 | 272 | | $a_1b_5a_1b_5$ | | | | | 2 | 2 | | 430–434 |

*Figure 20B*

| *Fig. 20A* |
| --- |
| *Fig. 20B* |

*Figure 20*

LZW DATA COMPRESSION AND DECOMPRESSION APPARATUS AND METHOD USING GROUPED DATA CHARACTERS TO REDUCE DICTIONARY ACCESSES

BACKGROUND OF THE INVENTION

1. Field of the Invention

The invention relates to LZW data compression and decompression systems particularly with respect to reducing compressor and decompressor dictionary accesses by forming portions of the compressor input data character stream into grouped data characters recognizable by the compressor and decompressor.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW, adopted as the standard for V.42 bis modem compression and decompression, is described in U.S. Pat. No. 4,558,302 by Welch, issued Dec. 10, 1985. LZW has been adopted as the compression and decompression standard used in the GIF image communication protocol and is utilized in the TIFF image communication protocol. GIF is a development of CompuServe Incorporated and the name GIF is a Service Mark thereof. A reference to the GIF specification is found in GRAPHICS INTERCHANGE FORMAT, Version 89a, Jul. 31, 1990. TIFF is a development of Aldus Corporation and the name TIFF is a Trademark thereof. Reference to the TIFF specification is found in TIFF, Revision 6.0, Final—Jun. 3, 1992.

Further examples of LZ dictionary based compression and decompression systems are described in the following U.S. patents: U.S. Pat. No. 4,464,650 by Eastman et al., issued Aug. 7, 1984; U.S. Pat. No. 4,814,746 by Miller et al., issued Mar. 21, 1989; U.S. Pat. No. 4,876,541 by Storer, issued Oct. 24, 1989; U.S. Pat. No. 5,153,591 by Clark, issued Oct. 6, 1992; U.S. Pat. No. 5,373,290 by Lempel et al., issued Dec. 13, 1994; U.S. Pat. No. 5,838,264 by Cooper, issued Nov. 17, 1998; and U.S. Pat. No. 5,861,827 by Welch et al., issued Jan. 19, 1999.

In the above dictionary based LZ compression and decompression systems, the compressor and decompressor dictionaries may be initialized with all of the single character strings of the character alphabet. In some implementations, the single character strings are considered as recognized although not explicitly stored. In such systems the value of the single character may be utilized as its code and the first available code utilized for multiple character strings would have a value greater than the single character values. In this way the decompressor can distinguish between a single character string and a multiple character string and recover the characters thereof. For example, in the ASCII environment, the alphabet has an 8 bit character size supporting an alphabet of 256 characters. Thus, the characters have values of 0–255. The first available multiple character string code can, for example, be 258 where the codes 256 and 257 are utilized as control codes as is well known.

In the above dictionary based LZ compression and decompression systems, numerous dictionary accesses are required at the compressor for compressing an input stream of data characters and also at the decompressor to recover the data characters from the compressed code stream. At the compressor at least one dictionary access is required for each input data character and at the decompressor at least one dictionary access is required for each recovered data character. It is desirable in such systems to minimize the number of dictionary accesses so as to enhance system performance.

SUMMARY OF THE INVENTION

A data compressor compresses an input stream of data characters into an output stream of compressed codes by storing strings of data characters encountered in the input, a string being stored as at least one grouping of a predetermined number of the data characters (grouped character) followed by one or more of the data characters. Each stored string has a code associated therewith. In a compression cycle, the input stream is formed into at least one grouped character followed by one or more of the data characters to provide a formed input stream. The formed input stream is compared to the stored strings by matching the grouped character(s) of the formed input stream with the grouped character(s) of the stored strings and sequentially matching the data character(s) of the formed input stream that follow the grouped character(s) thereof with the data character(s) of the stored strings that follow the grouped character(s) thereof until one of the data characters causes a mismatch to occur. In this manner, the longest match between the formed input stream and the stored strings is determined. An extended string is stored comprising the longest match extended by the data character that caused the mismatch and a code is assigned to the stored extended string. The code associated with the longest match is output so as to provide the stream of compressed codes. A grouped character comprising the data character that caused the mismatch concatenated by one less than the predetermined number of the next following data characters is used to begin the next compression cycle.

The predetermined number of data characters of the grouped character is selected so that the grouped character is recognized at the decompressor and the data characters comprising the grouped character can be recovered thereat.

In one embodiment, data character strings comprise an initial grouped character followed by as many data characters as can be matched. In another embodiment, a string is comprised of consecutive grouped characters followed by one or more data characters up to a maximum of one less than the predetermined number. In this embodiment, when extension of a string for storage would result in the predetermined number of data characters following the consecutive grouped characters, the predetermined number of data characters is appended to the consecutive grouped characters as a further grouped character.

The invention further includes a novel data decompressor for recovering the input stream of data characters from the output stream of compressed codes for each compressor embodiment. The decompressor recreates, from the stream of compressed codes, the strings stored at the compressor in lock-step fashion therewith. Furthermore, each decompressor utilizes novel exception case processing based on that of said U.S. Pat. No. 4,558,302.

BRIEF DESCRIPTION OF THE DRAWINGS

FIG. 1 is a schematic block diagram of a data compressor for compressing data in accordance with the present invention.

FIG. 3 is a chart exemplifying the operations of the compressor of FIG. 1 in accordance with the control flow chart of FIG. 2.

FIG. 4 is a schematic block diagram of a data decompressor embodied in accordance with the present invention for recovering data compressed by the compressor of FIG. 1.

FIG. 8 is a chart exemplifying the operations of the decompressor of FIG. 4 in accordance with the control flow charts of FIGS. 5, 6 and 7.

FIG. 11 is a chart exemplifying the operations of the compressor of FIG. 9 in accordance with the control flow chart of FIG. 10.

FIG. 20 is a chart exemplifying the operations of the decompressor of FIG. 12 in accordance with the control flow charts of FIGS. 13–19.

DESCRIPTION OF THE PREFERRED EMBODIMENTS

Figure 2:
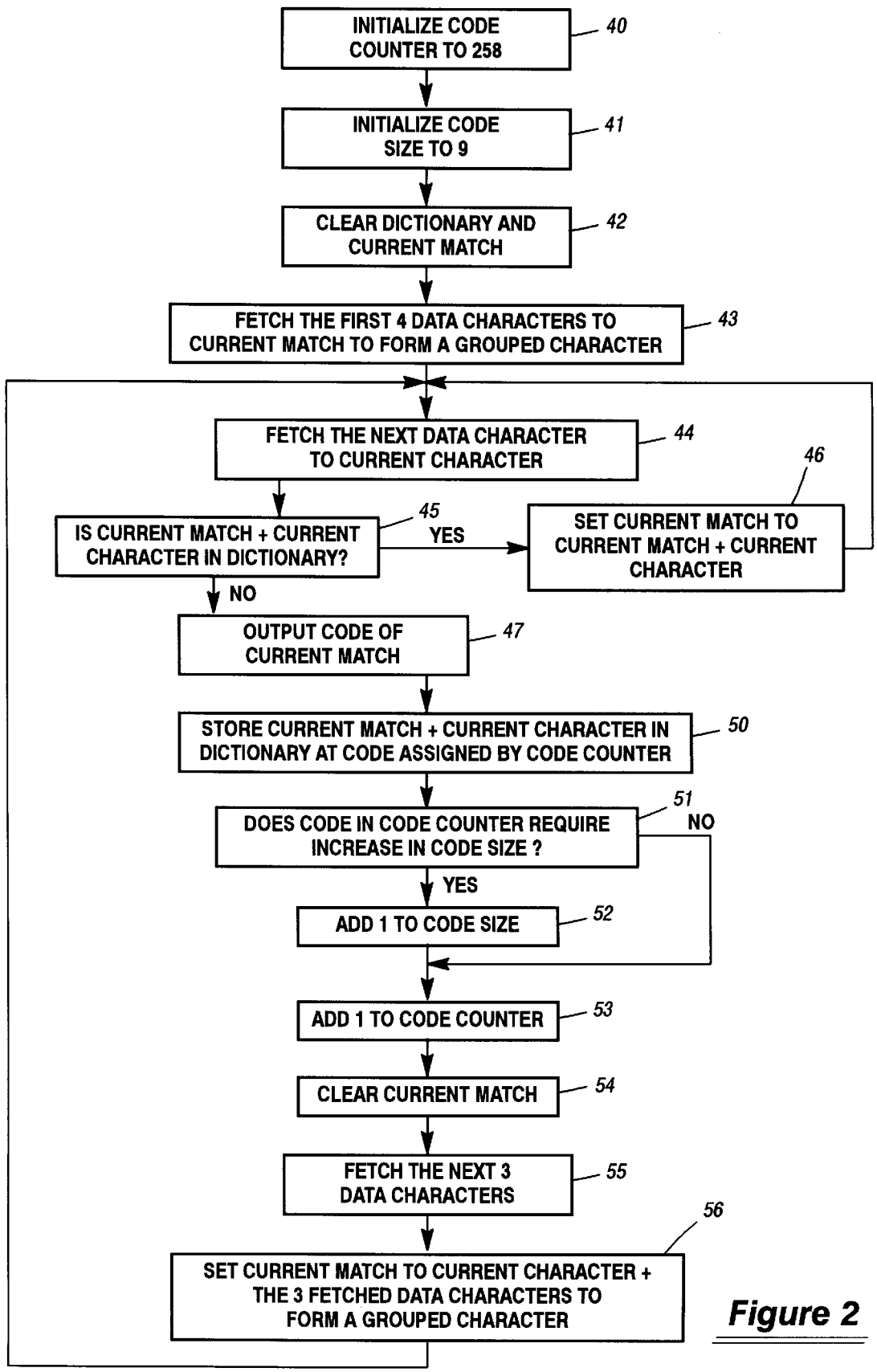
FIG. 2 is a control flow chart illustrating the operations executed by the compressor of FIG. 1 so as to perform data compression in accordance with the present invention.

In the present invention, groupings of a predetermined number of input data characters are recognized, or alternatively stored, at the compressor and decompressor of a data compression and decompression system. When the alphabet over which data compression and decompression is performed is comprised of a small number of data characters, all combinations of a predetermined number of consecutive data characters can form a set having a relatively small number of groupings.

Consider, for example, a 4 character alphabet having a character size of 2 bits. All combinations of 4 consecutive characters form a set of 256 groupings. Each grouping can be considered as an 8 bit character over an alphabet comprising 256 characters. For convenience, such a character will be referred to herein as a "grouped character". Alphabets comprising 4 characters are prevalent on the Internet, for example, in the 4 color images (e.g., advertisements, logos, banners, labels and buttons) transported thereon. In such an image, each image pixel can assume one of four colors.

The best mode embodiments described below are specifically directed to a 4 character alphabet where the grouped character comprises 4 consecutive 2 bit data characters and, therefore, the grouped character is 8 bits wide. It is appreciated that the invention is also applicable to other alphabet sizes and data character groupings.

In the described embodiments, the 256 grouped characters are assumed to be recognized at the compressor and decompressor based on the values of the characters. In the described embodiments, a grouped character will have a value of less than 256. Strings longer than a single grouped character will have codes greater than 256. It is appreciated that the present invention could also be implemented utilizing embodiments wherein the dictionaries are initialized to store the 256 grouped characters.

Two embodiments of the invention are described in detail below. In the embodiment of FIGS. 1–8, each string begins with a grouped character and is extended by matching individual data characters. The compressor and decompressor each utilize a single dictionary. In the embodiment of FIGS. 9–20, consecutive grouped characters are matched followed by matching data characters up to one less than the predetermined number of data characters comprising the grouped character. In this embodiment two dictionaries are utilized. In the first dictionary, strings of consecutive grouped characters are stored. The second dictionary is utilized to store data character extensions of the strings stored in the first dictionary.

The embodiments described below utilize dictionaries that contain 4096 locations requiring a 12 bit wide address. Many of the fields and registers to be described are, therefore, 12 bits wide. The embodiments are also described in terms of a variable code size that varies between 9 and 12 bits. When a grouped character of 8 bits or a code of less than 12 bits is set into a 12 bit field or register, the quantity is considered right justified in the field or register with the additional high order bits zero filled.

Referring to FIG. 1, a data compressor 10 is illustrated that compresses a stream of input data characters applied at an input 11 into a stream of corresponding compressed codes at an output 12. The compressor 10 includes a 12 bit wide Current Match register 13, a 2 bit wide Current Character register 14 and a Code Size register 15. The Code Size register 15 is utilized in a well known manner to control the number of bits utilized for transmitting the compressed codes from the output 12. The compressor 10 also includes Working Buffers 16 to provide buffering for fetched data characters in a manner to be discussed. The compressor 10 further includes a Code Counter 17 for sequentially generating code values to be assigned to character strings in a manner to be described. The compressor 10 additionally includes control 20 for controlling the operations of the compressor 10 in accordance with the operational flow chart of FIG. 2 to be described below.

Also included is a Dictionary 21 for storing character strings in cooperation with the compressor 10. Specifically, the Dictionary 21 contains 4096 locations configured as indicated at reference numeral 22. A Dictionary location includes a 12 bit wide Prefix Code field 23 and a 2 bit wide Data Character field 24. A location is accessed in the Dictionary 21 by a 12 bit wide address 25. In a well known manner, a string is stored in the Dictionary 21 by storing the code of the string prefix in the Prefix Code field 23 and the string extension data character in the Data Character field 24 of a location 22 of the Dictionary. For convenience, the address 25 is utilized as the string code. Data is communicated between the compressor 10 and the Dictionary 21 via a bi-directional data bus 26 under control of a control bus 27.

The Dictionary 21 is conveniently configured and utilized as an associative memory for string searching and storage in the manner described in said U.S. Pat. No. 5,838,264. String searching and storage may also be effected by other arrangements, such as by hashing, as is well known in the art.

Further included is an Input Data Character Buffer 30 that buffers the input data character stream received at the input 11. The input data characters are applied from the Input Data Character Buffer 30 via a bus 31 to the Current Match register 13, the Current Character register 14 and the Working Buffers 16 in accordance with operations to be described. The compressor 10 controls acquiring input data characters from the Input Data Character Buffer 30 via a control bus 32.

Briefly, the operation of the compressor 10 is as follows. At the beginning of a compression cycle, the Current Match register 13 contains a grouped character that is established at the end of the preceding compression cycle. At the beginning of the cycle, the next input data character is fetched to the Current Character register 14. The Dictionary 21 is searched for the string represented by the contents of the Current Match register 13 and the Current Character register 14. Conveniently, the Dictionary 21 is utilized, as described above, as an associative memory where the contents of the Current Match register 13 and the contents of the Current Character register 14 are compared to the Prefix Code field 23 and the Data Character field 24, respectively. If the string is found in the Dictionary 21, the string code represented by the address 25 is loaded into the Current Match register 13 and the next input data character is fetched to the Current Character register 14. The search continues until the string represented by the contents of the Current Match register 13 and the Current Character register 14 is not found in the Dictionary 21. In this manner, the input data character stream is matched against the strings in the Dictionary 21 until the longest match is determined.

The code of the longest matching string is output at the compressed output 12 from the Current Match register 13 utilizing the number of bits determined by the Code Size register 15. An extended string is stored in the Dictionary 21 by storing the contents of the Current Match register 13 and the contents of the Current Character register 14 in the Prefix Code field 23 and the Data Character field 24, resepctively, of the Dictionary location addressed by the Code Counter 17. The Code Counter 17 is incremented by 1 and the code size in the Code Size register 15 is incremented by 1 when the code in the Code Counter 17 indicates that an increase in code size is required.

The compression cycle is concluded by setting the Current Match register 13 to the grouped character comprising the character in the Current Character register 14 concatenated with the next 3 fetched input data characters.

The first compression cycle performed by the compressor 10 is initiated by fetching the first 4 input data characters to the Current Match register 13 to form a grouped character and by fetching the next input data character to the Current Character register 14.

Referring to FIG. 2, with continued reference to FIG. 1, a control flow chart is illustrated showing the detailed operations to be executed by the compressor 10. The flow chart of FIG. 2 is predicated on a variable length output and the Code Size register 15 is utilized to this effect. In the preferred embodiment of the present invention, 256 grouped characters are utilized as explained above. Therefore, the code size begins with 9 bits and sequentially increases to 10, 11 and 12 bits at codes 512, 1024 and 2048, respectively.

Accordingly, at a block 40, the Code Counter 17 is initialized to a first available code of, for example, 258. At a block 41, the Code Size register 15 is initialized to the beginning code size of 9 bits. At a block 42, the Dictionary 21 and the Current Match register 13 are cleared to zero.

At a block 43, the first 4 input data characters are fetched to the Current Match register 13 to form a grouped character and at a block 44 the next input data character is fetched to the Current Character register 14.

Processing continues at a block 45 whereat the Dictionary 21 is searched to determine if the string comprising the current match concatenated by the current character is in the Dictionary. As described above, the Dictionary searching is performed associatively and other known Dictionary searching procedures may be utilized to the same effect.

If, at the block 45, the string is found in the Dictionary 21, the YES branch from the block 45 is taken to a block 46. At block 46, the contents of the Current Match register 13 is updated to contain the code of the string that was found. At block 46, therefore, the address 25 of the currently matched string is set into the Current Match register 13. After updating the Current Match register 13 with the currently matched string, control returns to the block 44 to fetch the next input data character to the Current Character register 14. In this manner, the loop formed by the blocks 44–46 compares the input data character stream with the strings stored in the Dictionary 21 to find the longest match therewith.

At the block 45, when the concatenation of the currently matched string with the next data character fetched at the block 44 results in an extended string that is not in the Dictionary 21, the NO branch from the block 45 is taken to a block 47. At the block 47, the code of the current match is output as part of the compressed code stream provided at the compressor output 12. The code of the current match is provided by the Current Match register 13. The code is output utilizing the number of bits denoted by the Code Size register 15. When current match is a grouped character extended by one or more data characters, the code thereof residing in the Current Match register 13 represents the longest match found in the Dictionary 21 as described above.

It is appreciated that the code of the current match that is output at the block 47 can also be a grouped character having a value of from 0 to 255. The code that is output for extended strings will have a value from 258 through 4095.

Processing proceeds to a block 50 whereat the extended string that was not found in the Dictionary at the block 45 is entered therein and the extant code of the Code Counter 17 is assigned to this stored extended string. The block 50 is implemented by storing the contents of the Current Match register 13 and the contents of the Current Character register 14 in the Prefix Code field 23 and the Data Character field 24, respectively, of the Dictionary location addressed by the Code Counter 17.

Processing then proceeds to a block 51 whereat the code in the Code Counter 17 is tested to determine if an increase in the code size is required. If so, processing continues to a block 52 whereat the Code Size register 15 is incremented by 1. If an increase in code size is not required at the block 51, the block 52 is bypassed to continue processing at a block 53. At block 53, the Code Counter 17 is incremented by 1.

Processing then proceeds to a block 54 whereat the Current Match register 13 is cleared and at a block 55, the next 3 input data characters are fetched to the Working Buffers 16. At a block 56, the Current Match register 13 is set to the current character in the Current Character register 14 concatenated with the 3 fetched data characters in the Working Buffers 16 to form a grouped character with which to begin the next compression cycle. Accordingly, control returns to the block 44 to fetch the next data character to the Current Character register 14.

Referring to FIG. 3, with continued reference to FIGS. 1 and 2, an example of the operation of the compressor 10 in accordance with the flow chart of FIG. 2 is illustrated. At the top of FIG. 3, an input data character stream is shown where sequential characters are identified by character sequence numbers. This is done to facilitate following the progress of the characters through the steps of the example. It is appreciated that the sequence numbers are shown for purposes of character identification and do not appear in the actual data character stream.

As discussed above, the embodiments described herein are predicated on an underlying data character alphabet of 4 characters, e.g., a, b, c and d. The example input data character stream at the top of FIG. 3 utilizes a repetition of the characters a, b and c to exemplify the operations of the compressor 10. The example is largely self-explanatory, with the actions performed delineated in the left-hand column and the blocks of FIG. 2 that participate in the actions designated in the right-hand column.

In actions 1–4, 6, 8, 10, 13, 17 and 20, the grouped character that initiates each respective string search is illustrated. In action 1, for example, the grouped character that is set into the Current Match register 13 at block 43 is "abca". At block 45, the string for which the compressor 10 is searching in the Dictionary 21 is the concatenation of current match with current character, which, in action 1, is "abca b". Since this string is not yet in the Dictionary, it is stored therein in block 50 at code 258 and the code of the current match is output at block 47, namely "abca". It is appreciated, as explained above, that the value of this code is less than 256. In this manner the decompressor will recognize that it is receiving a grouped character and will extract the data characters therefrom.

Actions 10–12 depict the search at blocks 44–46 for the string comprising the grouped character "abca" extended by the data characters "b" and "c". This search results in the output, at action 12, of the code 261. Since this code is greater than 256, the decompressor will recognize that it is the code for an extended string and can access the characters thereof from the decompressor dictionary in a manner to be described.

Actions 13–16 illustrate a string search that results in exception case processing which will be described in greater detail with respect to the decompressor of FIG. 4. The exception case processing utilized herein is a modification of the exception case processing described in said U.S. Pat. No. 4,558,302.

More detailed descriptions of the actions of FIG. 3 relative to the blocks of FIG. 2 are readily apparent and will not be provided for brevity.

It is appreciated from FIGS. 2 and 3 that because each string search begins with a grouped character, dictionary accesses are reduced compared to prior art procedures. Additionally, since the string search continues after the initial grouped character with individual data characters of the input data character stream, the compression ratio will not be significantly affected.

Referring to FIG. 4, with continued reference to FIG. 1, a data decompressor 110 is illustrated that decompresses a stream of compressed codes applied at an input 111 into a recovered stream of data characters at an output 112. It is appreciated that the compressed code stream from the output 12 of the compressor 10 (FIG. 1), if applied to the input 111 of the decompressor 110, results in the recovery, at the output 112 of the decompressor 110, of the original input data character stream applied to the input 11 of the compressor 10.

A Dictionary 121 is included for storing data character strings corresponding to received compressed code inputs. In the operation of the decompressor 110, the contents of the Dictionary 121 are maintained identical to the contents of the Dictionary 21 of the compressor 10 of FIG. 1. The Dictionary 121 is preferably implemented by a RAM and the data structure thereof is arranged in a manner similar to that described above with respect to the Dictionary 21. Accordingly, a location 122 includes a 12 bit wide Prefix Code field 123 and a 2 bit wide Data Character field 124. The location 122 is accessed by a 12 bit wide address 125. In a manner similar to that described above with respect to the Dictionary 21, a string is stored in the Dictionary 121 by storing the string prefix code in the field 123 and the string extension character in the field 124. The string code for the string stored at the location 122 is conveniently provided by the address 125. Data is communicated between the decompressor 110 and the Dictionary 121 via a bi-directional data bus 126 under control of a control bus 127.

The decompressor 110 includes a 12 bit wide Current Code register 130, a 12 bit wide Previous Code register 131 and a Code Size register 132. The Code Size register 132 performs a similar function to that described above with respect to the Code Size register 15 of the compressor 10 in that the Code Size register 132 determines the number of bits in which the decompressor 110 receives input compressed codes. The decompressor 110 further includes a Code Counter 133 for sequentially generating code values to be assigned to extended strings stored in the Dictionary 121 by the decompressor 110. The Code Counter 133 maintains a lock-step relationship with the Code Counter 17 of the compressor 10 of FIG. 1 as will be appreciated from the descriptions to follow.

The decompressor 110 further includes Dictionary String Recovery logic 134 for recovering strings stored in the Dictionary 121 that are accessed by compressed codes. The general methodology for recovering data character strings from a dictionary in response to the string code corresponding thereto is known in the art of data compression and decompression (see, e.g., U.S. Pat. No. 4,558,302). The specific string recovery operations performed with respect to the initial grouped character of each string will be described below.

The decompressor 110 further includes Grouped Character To Data Character Conversion logic 135. The logic 135 recovers, from a grouped character, the individual data characters comprising the grouped character. The decompressor 110 also includes Data Character String Forming buffers 136. The buffers 136 are utilized by the logic 134 and 135 in assembling the data characters comprising a string recovered from the Dictionary 121. Further included in the decompressor 110 is control 137 for controlling the operations of the decompressor 110 in accordance with the operational flow charts of FIGS. 5–7 in a manner to be described.

Included with the decompressor 110 is an Input Code Buffer 140 that buffers the input compressed codes received at the input 111. The individual input codes are applied from the Input Code Buffer 140, via a bus 141, to the Current Code register 130 in accordance with operations to be described. The decompressor 110 controls acquiring input codes from the Input Code Buffer 140 via a control bus 142.

Briefly, the operation of the decompressor 110 is as follows. A code is fetched to the Current Code register 130 utilizing the number of bits determined by the code size in Code Size register 132. The fetched code is examined to determine if it is less than 256. If so, the input code comprises a grouped character transmitted by the compressor 10. The 4 data characters comprising the fetched grouped character in the Current Code register 130 are provided at the output 112 as the recovered data characters of the string corresponding to current code. The Grouped Character To Data Character Conversion logic 135 and the Data Character String Forming buffers 136 are utilized in this string recovery process. Since the 4 data characters comprising the fetched grouped character are contiguous in the Current Code register 130, the recovered data characters are readily extracted from the register 130 by the logic 135 and placed in the buffers 136 for outputting. It is appreciated that access to the Dictionary 121 is not required in this string recovery process.

The Dictionary 121 is then updated by storing an extended string comprising the previous code extended by the first data character of the fetched grouped character from the Current Code register 130. Accordingly, the previous code in the Previous Code register 131 is stored in the Prefix Code field 123 and the first data character of the fetched grouped character is stored in the Data Character field 124 of the Dictionary location accessed by the Code Counter 133. The Code Counter 133 is advanced and the Code Size register 132 is advanced if required and the current code in the register 130 is transferred to the Previous Code register 131 to conclude the cycle.

If the code fetched to the Current Code register 130 is not less than 256 and is less than the code in the Code Counter 133, the string corresponding to current code is recovered from the Dictionary 121. The general methodology for recovering a string from a dictionary is known as, for example, from said U.S. Pat. No. 4,558,302. Briefly, the Dictionary 121 is accessed by the fetched current code and the data character in the field 124 of the accessed Dictionary location is transferred to the buffers 136. The code in the field 123 is utilized to again access the Dictionary 121 and the data character at the accessed location is again stored in the buffers 136. The process continues until the code in the Prefix Code field 123 is less than 256.

In accordance with the present invention this prefix code in the field 123 comprises the initial grouped character of the string represented by current code. The 4 contiguous data characters of this grouped character are readily recovered utilizing the logic 135 and are transferred to the buffers 136 to complete the string recovery process. The data characters of the string in the buffers 136 are then provided to the output 112 in the appropriate order.

It is appreciated that the data characters of the string are recovered from the field 124 of the Dictionary 121 in reverse order. The buffers 136 are utilized to provide the data characters in the correct order. The Dictionary String Recovery logic 134 is utilized to perform the described operations.

It is appreciated that since each string stored in the Dictionary 121 begins with an initial grouped character, fewer Dictionary accesses are required than in the prior art since the initial grouped character, comprising 4 data characters, only requires one Dictionary access.

As above, the Dictionary 121 is updated, the Code Counter 133 and Code Size register 132 are incremented as required and the current code is transferred from the register 130 to the Previous Code register 131.

If the fetched input code in the Current Code register 130 is not less than the code in the Code Counter 133, exception case processing similar to that described in said U.S. Pat. No. 4,558,302 is utilized. Briefly, the code in the Previous Code register 131 is utilized to recover the previous string. The previous string is then utilized to recover the current string by extending the previous string by the first data character of the previous string. This extended string is then output as the current string and stored in the Dictionary 121. Different processing is utilized depending on whether the previous code is or is not less than 256 as will be described below.

As above, the Code Counter 133 and Code Size register 132 are incremented as required and the current code is transferred from the register 130 to the Previous Code register 131.

Figure 5:
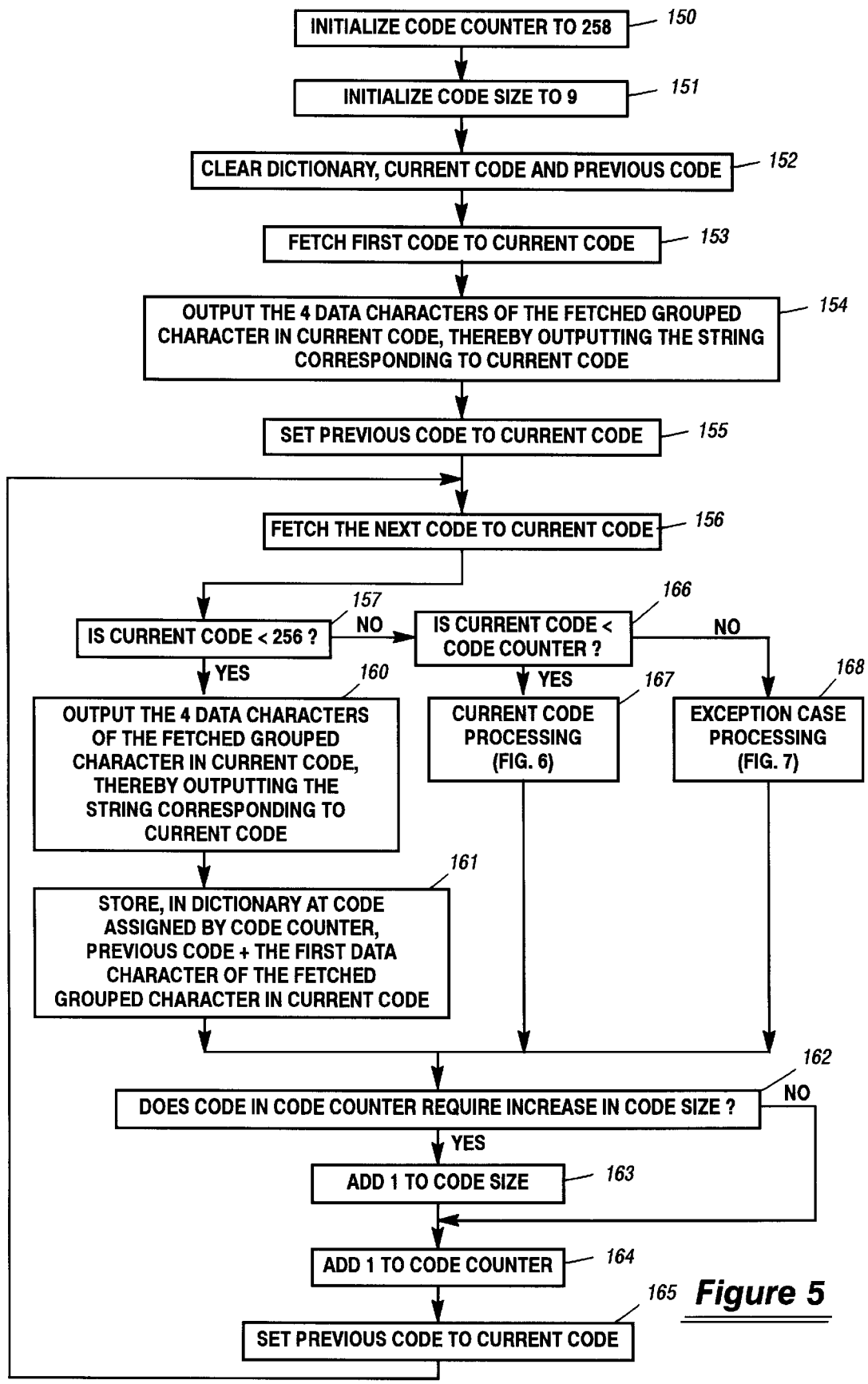
FIG. 5 is a control flow chart illustrating the operations executed by the decompressor of FIG. 4 so as to perform data decompression in accordance with the present invention.
Figure 6:
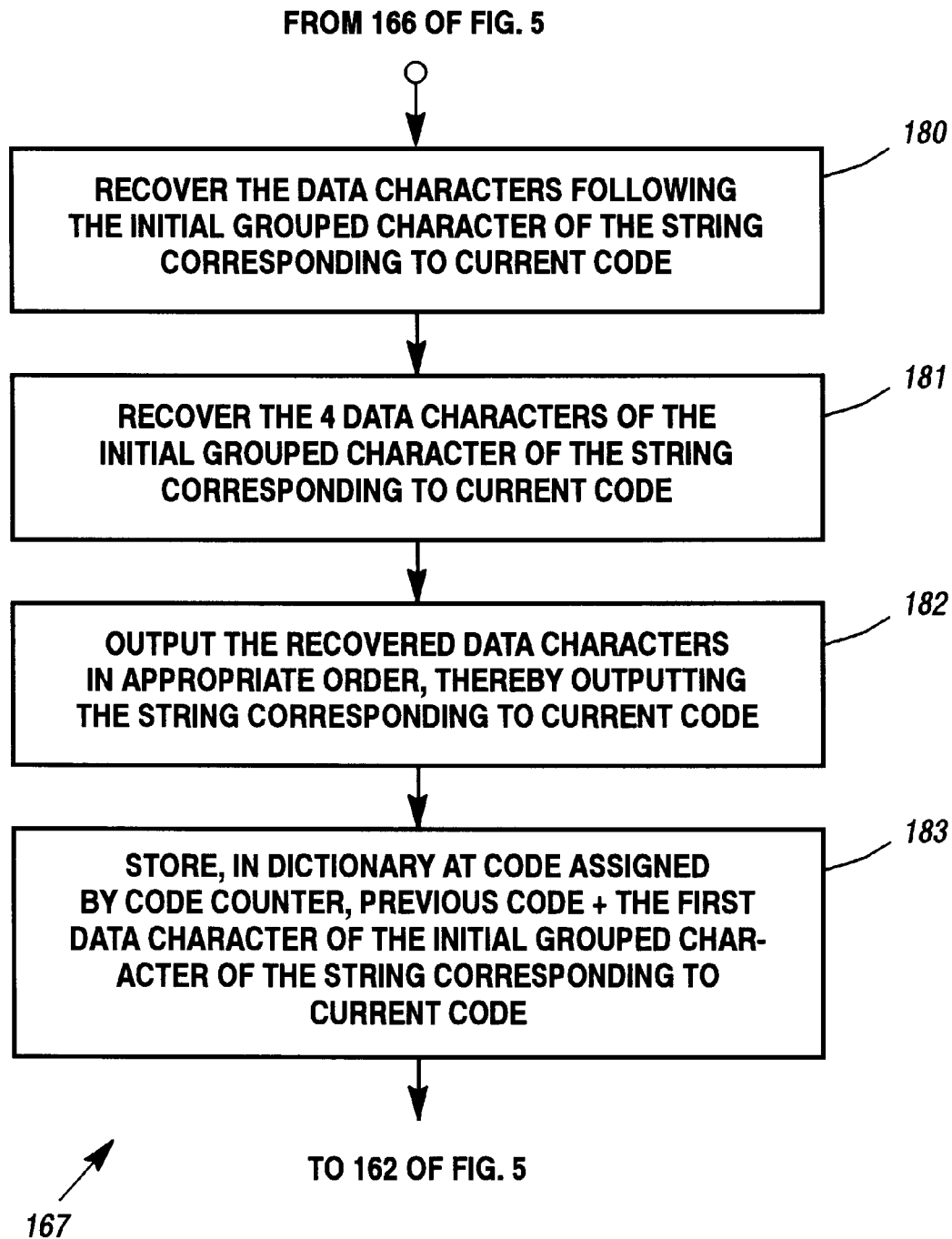
FIG. 6 is a control flow chart illustrating the Current Code processing logic utilized in the flow chart of FIG. 5.
Figure 7:
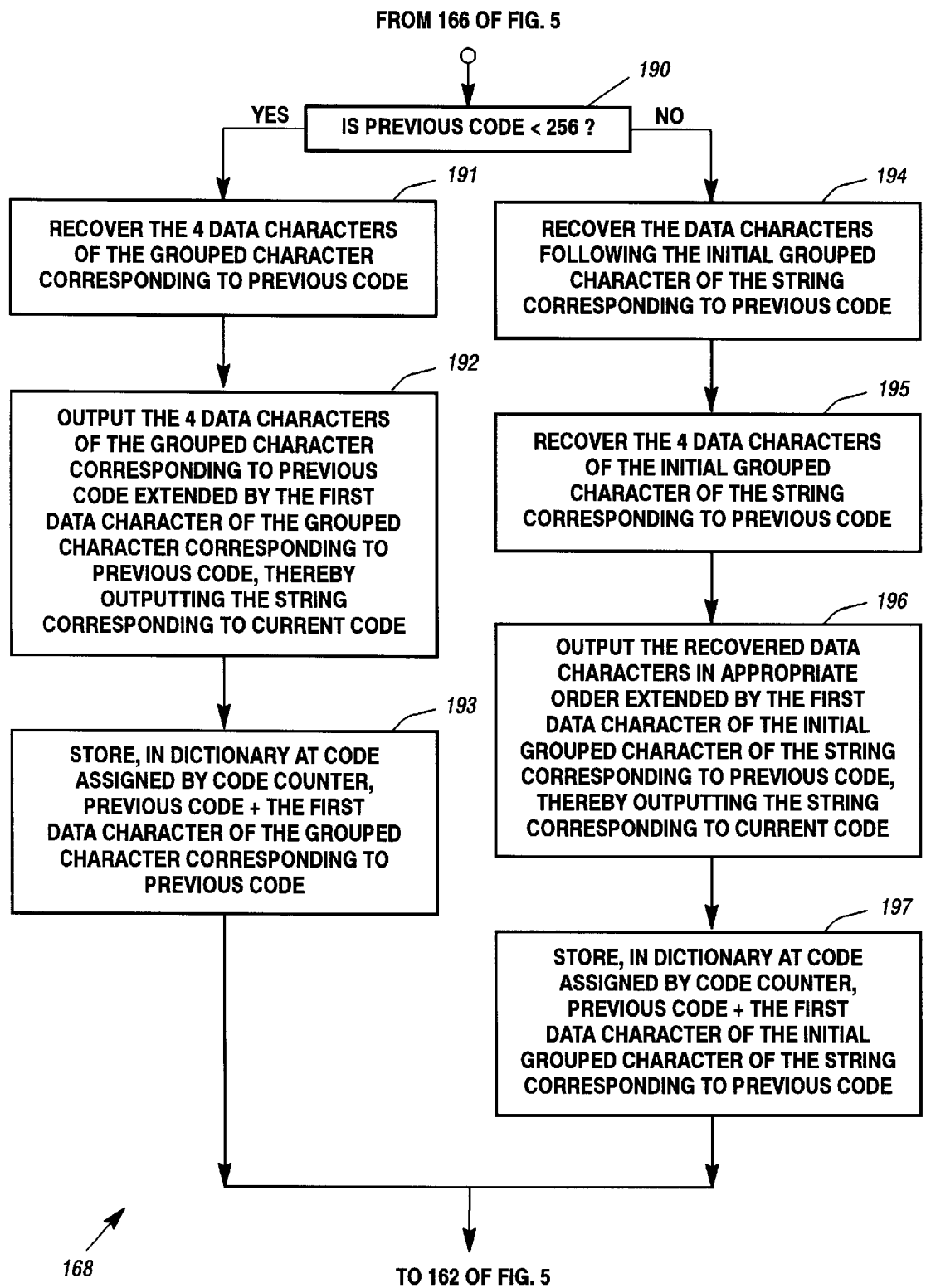
FIG. 7 is a control flow chart illustrating the Exception Case processing logic utilized in the flow chart of FIG. 5.

The control flow charts of FIGS. 5–7 illustrate the detailed operations to be executed by the decompressor 110. The control 137 is considered as containing appropriate circuitry such as state machines to control execution of the operations.

Referring to FIG. 5, with continued reference to FIG. 4, at a block 150, the Code Counter 133 is initialized in the same manner as described above with respect to the block 40 of FIG. 2. At a block 151, the Code Size register 132 is initialized to the beginning code size as explained above with respect to the block 41 of FIG. 2. At a block 152, the Dictionary 121, the Current Code register 130 and the Previous Code register 131 are cleared to zero.

At a block 153, the first input compressed code is fetched to the Current Code register 130 utilizing the number of bits determined by code size. Because of the above described operations of the compressor 10, the first fetched code is a grouped character. Accordingly, at a block 154, the 4 data characters of the fetched grouped character are provided at the decompressor output 112. The 4 data characters are recovered from the Current Code register 130 in the manner described above. The 4 outputted data characters comprise the string corresponding to current code. At a block 155, the current code in the Current Code register 130 is transferred to the Previous Code register 131.

At a block 156, the next input compressed code is fetched to the Current Code register 130. It is appreciated that the code fetched to the Current Code register 130 may represent either a grouped character or a string having an initial grouped character followed by subsequent data characters. As discussed above, such strings are distinguished from one another by the value of the code. A code representing a single grouped character has a value less than 256 while a code representing a longer string has a value that is not less than 256.

Accordingly, at a block 157, the code in the Current Code register 130 is tested to determine if current code is less than 256. If so, the YES branch is taken from the block 157 to a block 160 whereat the 4 data characters of the fetched grouped character in the Current Code register 130 are provided by the decompressor 110 at the output 112.

Processing proceeds to a block 161 whereat an extended string is stored in the Dictionary 121 comprising the previous code extended by the first data character of the fetched grouped character in the Current Code register 130. The extended string is stored in the Dictionary 121 at the code assigned by the Code Counter 133. The block 161 is implemented by storing the contents of the Previous Code register 131 and the first data character of the fetched grouped character in the Prefix Code field 123 and the Data Character field 124, respectively, of the Dictionary location addressed by the Code Counter 133.

Processing proceeds to blocks 162–164 whereat incrementation of the Code Counter 133 and the Code Size register 132 are performed in the manner described above with respect to the blocks 51–53 of FIG. 2. In this manner, the Code Counter 133 of the decompressor 110 remains in lock-step with the Code Counter 17 of the compressor 10.

Processing proceeds to a block 165 whereat the current code in the Current Code register 130 is transferred to the Previous Code register 131. Processing then loops back to the block 156 to fetch the next input compressed code.

If, at the block 157, current code is not less than 256, the No branch from the block 157 is taken to a block 166 whereat the current code is tested against the code in the Code Counter 133. If current code in the Current Code register 130 is less than the code in the Code Counter 133, the YES branch from the block 166 is taken to a block 167. At the block 167, Current Code processing is performed, as will be discussed in detail with respect to FIG. 6.

If at the block 166, current code is not less than the code in the Code Counter 133, the NO branch is taken from the block 166 to a block 168. At the block 168, Exception Case processing is performed, as will be described in detail with respect to FIG. 7. It is appreciated that Exception Case processing will be invoked in the embodiment described herein when the received compressed code is equal to the code in the Code Counter 133.

Processing continues from the blocks 167 and 168 to the block 162 described above.

Referring to FIG. 6, with continued reference to FIGS. 4 and 5, details of the Current Code processing of the block 167 of FIG. 5 are illustrated. It is appreciated that the Current Code processing of FIG. 6 is invoked when the decompressor 110 receives an input compressed code that represents a string that is stored in the Dictionary 121. In the present embodiment the stored string begins with an initial grouped character followed by one or more data characters.

Accordingly, at a block 180, the data characters following the initial grouped character of the string corresponding to current code are recovered from the Dictionary 121. At a block 181, the 4 data characters that comprise the initial grouped character of the string are recovered. The data character recovery of the blocks 180 and 181 were described above with respect to FIG. 4 utilizing the logic 134 and 135 and the buffers 136.

At a block 182, the data characters recovered at the blocks 180 and 181 are output by the decompressor 110 in appropriate order. Thus, the recovered data character string at the output 112 corresponds to the compressed code fetched to the Current Code register 130.

The Dictionary 121 is updated at a block 183 by storing an extended string comprising the string corresponding to the code in the Previous Code register 131 extended by the first data character of the initial grouped character of the string corresponding to current code. This stored extended string is assigned the string code value of the extant code of the Code Counter 133. The block 183 is implemented by storing previous code from the Previous Code register 131 and the first data character of the initial grouped character recovered at the block 181 in the Prefix Code field 123 and the Data Character field 124, respectively, of the location of the Dictionary 121 addressed by the Code Counter 133. Processing then continues at the block 162 of FIG. 5.

When the compressed code fetched to the Current Code register 130 invokes the Exception Case processing of block 168 of FIG. 5, the Dictionary 121 is not yet storing the string corresponding to current code. The Exception Case processing of block 168 constructs this string from the string corresponding to previous code as illustrated in detail in FIG. 7.

Referring to FIG. 7, with continued reference to FIGS. 4 and 5, details of the Exception Case processing of block 168 of FIG. 5 are illustrated. The Exception Case processing of FIG. 7 proceeds differently if previous code in the Previous Code register 131 represents a grouped character or an extended string. Accordingly, at a block 190, the previous code is tested to determine if it less than 256. If previous code is less than 256, the YES branch is taken from the block 190 to a block 191. At the block 191, the 4 data characters of the grouped character corresponding to previous code are recovered. The 4 data characters are recovered by the logic 135 from the Previous Code register 131 and are stored in the buffers 136 in a manner similar to that described above with respect to the recovery of the data characters of a grouped character from the Current Code register 130.

Processing proceeds to a block 192 whereat the 4 data characters of the grouped character corresponding to previous code extended by the first data character of this grouped character are output by the decompressor 110. This extended string is the string corresponding to the code just fetched to Current Code register 130. The logic 135 extends the 4 data characters held in the buffers 136 by the first data character thereof and control 137 then outputs these 5 data characters from the buffers 136 to the output 112.

Processing proceeds to a block 193 whereat the Dictionary 121 is updated with an extended string comprising the string corresponding to previous code extended by the first data character of the grouped character corresponding to previous code. The string is stored in the Dictionary 121 at the string code assigned by the Code Counter 133. The function of block 193 is performed in a manner similar to that described above with respect to block 161 as follows. The code in the Previous Code register 131 is stored in the Prefix Code field 123 of the Dictionary location accessed by the extant code in the Code Counter 133. The first data character of the grouped character corresponding to previous code is stored in the Data Character field 124 of the accessed Dictionary location. This is readily accomplished since this data character is stored in the buffers 136 as described above.

Alternatively, this data character can be extracted from the Previous Code register 131 since it is part of the grouped character stored therein.

If, at the block 190, previous code is not less than 256, the NO branch is taken to a block 194. At the block 194, the data characters following the initial grouped character of the string corresponding to previous code are recovered. This operation is performed in the manner described above with respect to the block 180 of FIG. 6, except that in the block 194, the previous code is utilized rather than the current code.

Processing proceeds to a block 195 whereat the 4 data characters of the initial grouped character of the string corresponding to previous code are recovered. The processing of the block 195 is similar to that described above with respect to the block 181 of FIG. 6 except that the previous code string is utilized rather than the current code string. At this point in the processing, all of the data characters of the string corresponding to previous code are arranged in the buffers 136 in the appropriate order in the manner described above with respect to FIG. 6 with respect to the current code string.

Processing proceeds to a block 196 whereat the data character string recovered in the blocks 194 and 195 is extended by the first data character of the initial grouped character of this string and then output in the appropriate order at the decompressor output 112. By these operations the string corresponding to current code is recovered and output. The operations are readily performed in the manner generally described above with respect to block 182 of FIG. 6 except that the string was recovered from previous code rather than from current code. The string extending process of block 196 is readily performed in the buffers 136 since this first data character utilized to extend the string is already in the buffers 136 pursuant to the data character recovery process of the block 195.

Processing proceeds to a block 197 whereat the extended string constructed and output in the block 196 is effectively stored in the Dictionary 121 at the code assigned by the Code Counter 133. This is performed by storing the previous code in the Previous Code register 131 in the Prefix Code field 123 of the Dictionary location accessed by the extant code in the Code Counter 133. The first data character of the initial grouped character of the string corresponding to previous code is stored in the Data Character field 124 of this accessed Dictionary location. The data character utilized to extend the string is found in the buffers 136 as described above. Control then returns to the block 162 of FIG. 5.

Referring to FIG. 8, with continued reference to FIGS. 4–7, an example of the operation of the decompressor 110 in accordance with the flow charts of FIGS. 5–7 is illustrated. The format of FIG. 8 is generally similar to that of FIG. 3 and descriptions given above with respect to FIG. 3 are applicable. The Input Compressed Code Stream at the top of FIG. 8 is the compressor output illustrated in FIG. 3. It is observed that the output of FIG. 8 is the recovered data character stream illustrated at the top of FIG. 3.

It is noted that the Input Compressed Code Stream at the top of FIG. 8 begins with three grouped characters namely "abca", "bcab" and "cabc". In actions 1–3, these three grouped characters are processed by the denoted blocks of FIG. 5 without the use of dictionary string searching which otherwise would have been required in the prior art. Actions 4–7 and 9 exemplify the processing of the strings represented by input codes 258, 259, 260, 261 and 263. The string processing of these actions utilize the Current Code processing of block 167 detailed in FIG. 6.

Actions 8 and 10 exemplify the Exception Case processing of FIG. 7 for input codes 264 and 266, respectively. As described above, this Exception Case processing utilizes the Exception Case processing blocks 190 and 194–197.

More detailed descriptions of the actions of FIG. 8 relative to the blocks of FIGS. 5–7 are readily apparent and will not be provided for brevity.

It is appreciated that in the compressor and decompressor embodiment of FIGS. 1–8, numerous dictionary accesses are avoided compared to prior art implementations. For example, in FIG. 2, blocks 44 and 56, 4 data characters are concatenated and processed as grouped characters thereby eliminating numerous compressor dictionary accesses. In FIG. 5, block 160, grouped character inputs to the decompressor are processed without accessing the dictionary. Furthermore, in FIG. 6, block 181, and FIG. 7, block 195, the initial grouped character of a string is processed to provide 4 data characters of the string which otherwise would have required 4 separate dictionary accesses. Additionally, FIG. 7, block 191, recovers 4 data characters of a grouped character during Exception Case processing which does not require dictionary access.

It is appreciated that to the extent grouped characters are utilized, dictionary accesses are eliminated. However, utilizing grouped characters modifies the statistics of the underlying data potentially reducing the compression ratio. In the embodiment of FIGS. 1–8, a grouped character is utilized at the beginning of a string followed by as many data characters as can be matched. Therefore, a compromise is established between the elimination of dictionary accesses and the preservation of the data character statistics. In the compressor and decompressor embodiment of FIGS. 9–20, to be described, successive grouped characters are matched followed by up to 3 matching data characters. It is appreciated that compared to the embodiment of FIGS. 1–8, further dictionary accesses may be eliminated but with a further suppression of the original data statistics. Since, however, the underlying LZW process utilized herein adapts to the statistics of input data, any reduction of data compression should be minimal.

Figure 9:
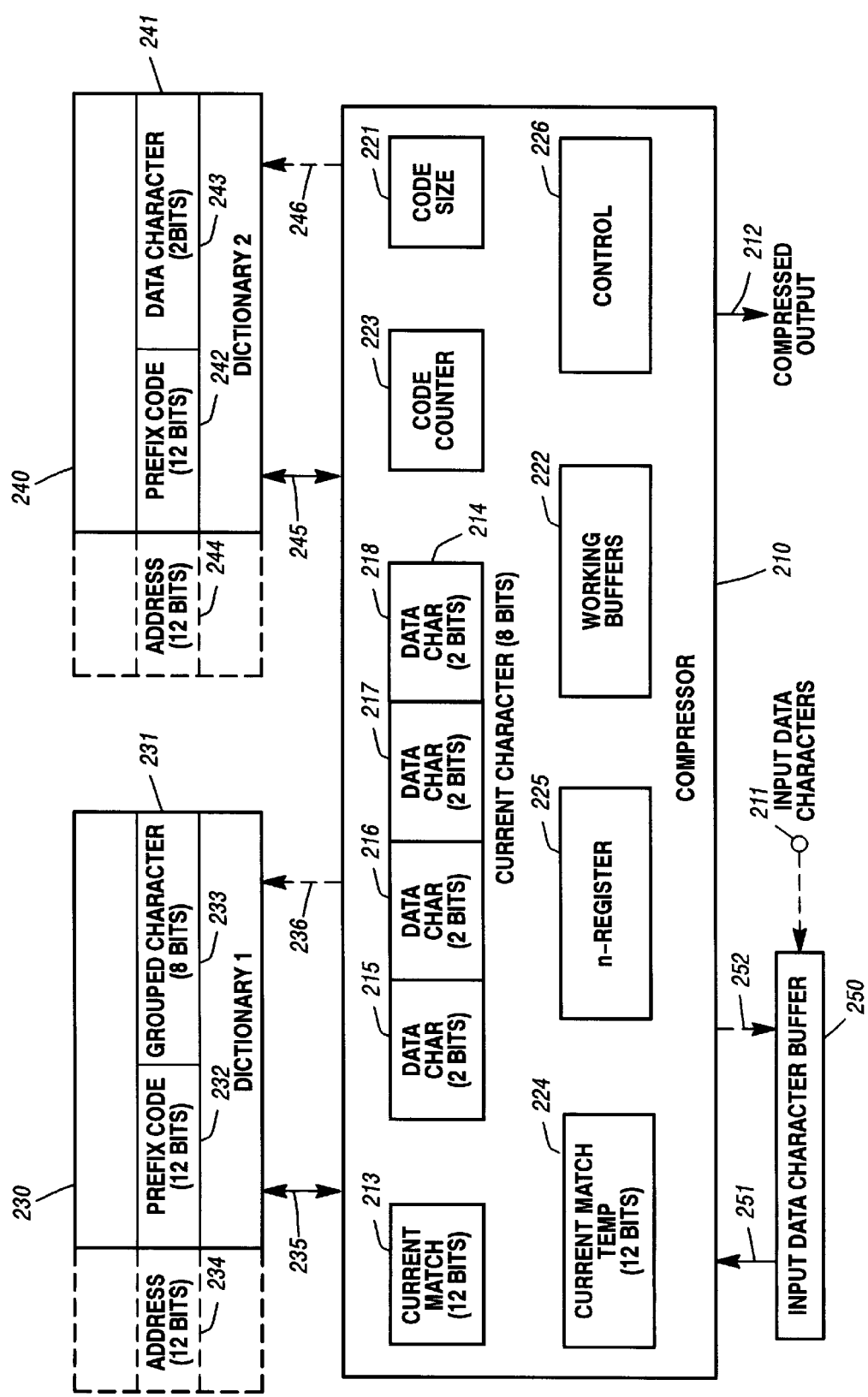
FIG. 9 is a schematic block diagram of an alternative embodiment of a data compressor for compressing data in accordance with the present invention.
Figure 10:
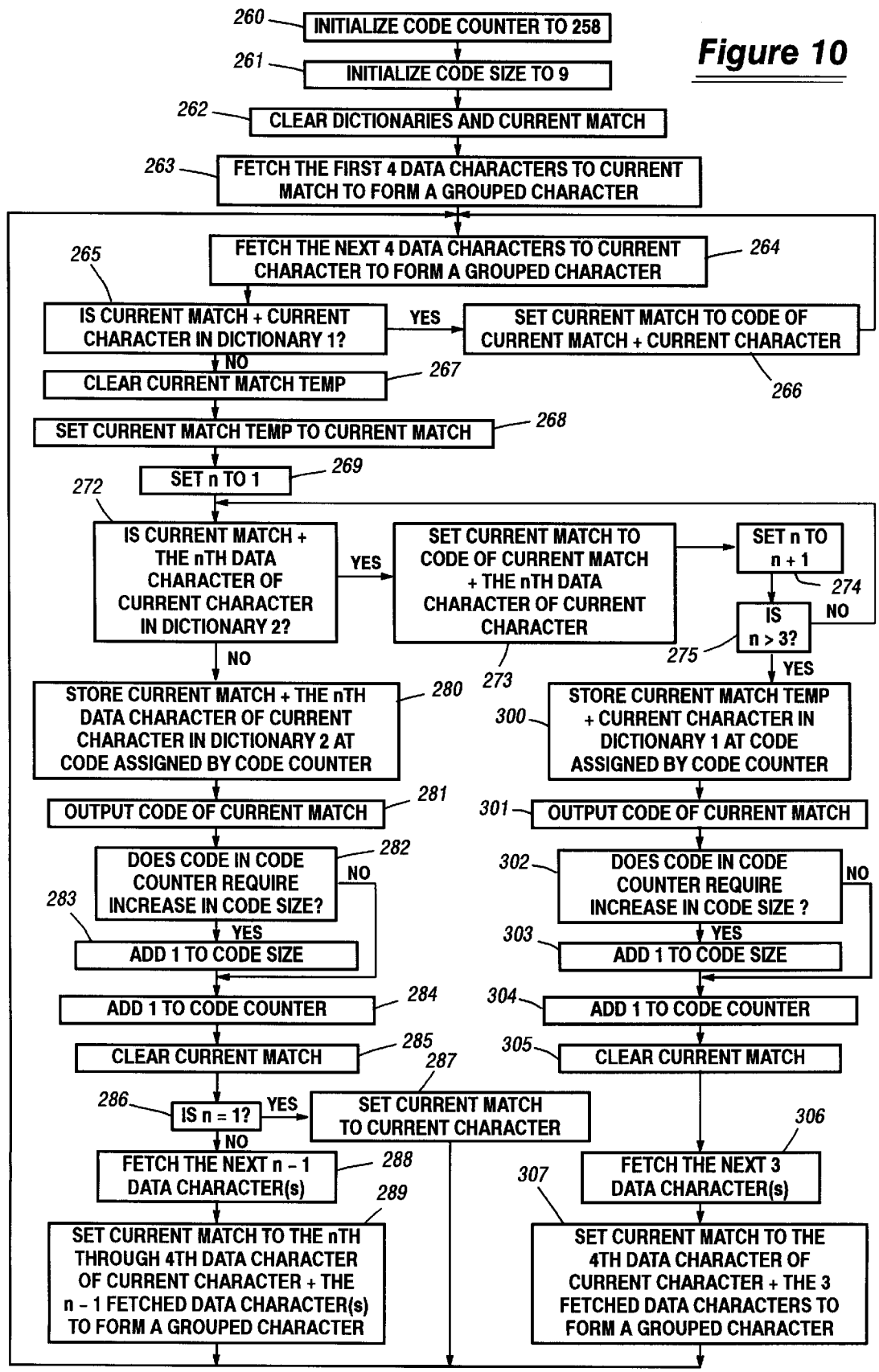
FIG. 10 is a control flow chart illustrating the operations executed by the compressor of FIG. 9 so as to perform data compression in accordance with the present invention.

FIGS. 9–11 depict a data compressor of an alternative embodiment of the invention. Referring to FIG. 9, a data compressor 210 is illustrated that compresses a stream of input data characters applied at an input 211 into a stream of corresponding compressed codes at an output 212. The compressor 210 includes a 12 bit wide Current Match register 213 and an 8 bit wide Current Character register 214 for holding a grouped character. The Current Character register 214 is comprised of 4 contiguous 2 bit wide data character fields 215–218 for holding and indexing the data characters comprising the grouped character. The compressor 210 includes a Code Size register 221 utilized in a well known manner to control the number of bits utilized for transmitting the compressed codes from the output 212. The compressor 210 further includes Working Buffers 222 to provide buffering for fetched data characters in a manner to be discussed. The compressor 210 also includes a Code Counter 223 for sequentially generating code values to be assigned to character strings in a manner to be described. The compressor 210 includes a 12 bit wide Current Match Temp register 224 for providing temporary storage of current match code values and an n-register 225 for holding an index n for reasons to be discussed. The compressor 210 additionally includes control 226 for controlling the operations of the compressor 210 in accordance with the operational flow chart of FIG. 10 to be described below.

Also included is a Dictionary 230 (denoted as Dictionary 1) for storing strings in cooperation with the compressor 210 that are comprised of consecutive grouped characters. The Dictionary 230 contains 4096 locations configured as indicated at reference numeral 231. A Dictionary location includes a 12 bit wide Prefix Code field 232 and an 8 bit wide Grouped Character field 233. A location is accessed in the Dictionary 230 by a 12 bit wide address 234. In a manner similar to that described above with respect to the Dictionary 21 of FIG. 1, a string is stored in the Dictionary 230 by storing the code of the string prefix in the Prefix Code field 232 and an extension grouped character in the Grouped Character field 233 of a location 231 of the Dictionary. For convenience, the address 234 is utilized as the string code. Data is communicated between the compressor 210 and the Dictionary 230 via a bi-directional data bus 235 under control of a control bus 236.

Also included is a Dictionary 240 (denoted as Dictionary 2) for storing single data character extensions of the strings stored in the Dictionary 230. The descriptions given with respect to elements 231–236 of the Dictionary 230 also apply to the elements 241–246, respectively, of the Dictionary 240 except for the 2 bit wide Data Character field 243. A string is stored in the Dictionary 240 by storing the code of the string prefix in the Prefix Code field 242 and the string extension data character in the Data Character field 243. The string code is provided by the address 244.

The Dictionaries 230 and 240 are conveniently configured and utilized as associative memories for string searching and storage generally in the manner described in said U.S. Pat. No. 5,838,264. String searching and storage may also be effected by other arrangements, such as by hashing, as is well known in the art.

Further included is an Input Data Character Buffer 250 that buffers the input data character stream received at the input 211. The input data characters are applied from the Input Data Character Buffer 250 via a bus 251 to the Current Match register 213, the Current Character register 214 and the Working Buffers 222 in accordance with operations to be described. The compressor 210 controls acquiring input data characters from the Input Data Character Buffer 250 via a control bus 252.

Briefly, the operation of the compressor 210 is as follows. At the beginning of a compression cycle, the Current Match register 213 contains a grouped character that is established at the end of the preceding compression cycle. At the beginning of the cycle, the next grouped character in the input data character stream is fetched to the Current Character register 214. The Dictionary 230 is searched for the string represented by the contents of the Current Match register 213 extended by the grouped character in the Current Character register 214. Conveniently, the Dictionary 230 is utilized, as described above, as an associative memory where the contents of the Current Match register 213 and the contents of the Current Character register 214 are compared to the Prefix Code field 232 and the Grouped Character field 233, respectively. If the string is found in the Dictionary 230, the string code represented by the address 234 is loaded into the Current Match register 213 and the next grouped character in the input data character stream is fetched to the Current Character register 214. The search continues until the string represented by the contents of the Current Match register 213 and the Current Character register 214 is not found in the Dictionary 230. When this occurs, the contents of the Current Match register 213 are temporarily stored in the Current Match Temp register 224 and the index n in the n-register 225 is set to 1. The Dictionary 240 is then searched for single data character extensions of current match.

Accordingly, the Dictionary 240 is associatively searched for the string represented by the contents of the Current Match register 213 extended by the first Data Character of the Current Character register 214 as indexed by n. In the manner described above with respect to the Dictionary 230, the contents of the Current Match register 213 and the contents of the first Data Character field 215 of the Current Character register 214 are compared to the Prefix Code field 242 and the Data Character field 243, respectively. If the string is found in the Dictionary 240, the string code represented by the address 244 is loaded into the Current Match register 213 and the index n in the n-register 225 is increased by 1. The search continues until the string represented by the contents of the Current Match register 213 and the contents of the nth Data Character field of the Current Character register 214 is not found in the Dictionary 240 or the index n becomes greater than 3.

If the searched for string is not found in the Dictionary 240, it is stored therein and the code of the current match from the Current Match register 213 is output. If the index n becomes greater than 3, the string represented by the contents of the Current Match Temp register 224 extended by the grouped character in the Current Character register 214 is stored in the Dictionary 230 and the code of the current match from the Current Match register 213 is output. In this manner, the input data character stream is matched against the strings in the Dictionaries 230 and 240 until the longest match is determined. The code of the longest matching string is output from the Current Match register 213 at the compressed output 212 utilizing the number of bits determined by the Code Size register 221.

Specifically, if the string was not found in the Dictionary 240, the extended string is stored therein by storing the contents of the Current Match register 213 and the contents of the $n^{th}$ Data Character field of the Current Character register 214 in the Prefix Code field 242 and the Data Character field 243, respectively, of the location of the Dictionary 240 addressed by the Code Counter 223. If the index n became greater than 3, the extended string is stored in the Dictionary 230 by storing the contents of the Current Match Temp register 224 and the contents of the Current Character register 214 in the Prefix Code field 232 and the Grouped Character field 233, respectively, of the location of the Dictionary 230 addressed by the Code Counter 223.

The Code Counter 223 is incremented by 1 and the code size in the Code Size register 221 is incremented by 1 when the code in the Code Counter 223 indicates that an increase in code size is required.

If the string was not found in the Dictionary 240 and n is equal to 1, the compression cycle is concluded by setting the Current Match register 213 to the contents of the Current Character register 214.

If the string was not found in the Dictionary 240 and n is 2 or 3, the compression cycle is concluded by setting the Current Match register 213 to the $n^{th}$ through the $4^{th}$ Data Character of the Current Character register 214 concatenated with the next n−1 fetched data characters.

If n is greater than 3, the compression cycle is concluded by setting the Current Match register 213 to the $4^{th}$ Data Character of the Current Character register 214 concatenated with the next 3 fetched data characters.

The first compression cycle performed by the compressor 210 is initiated by fetching the first 4 input data characters to the Current Match register 213 to form a grouped character and by fetching the next 4 data characters to the Current Character register 214 to form a grouped character.

Referring to FIG. 10, with continued reference to FIG. 9, a control flow chart is illustrated showing the detailed operations to be executed by the compressor 210. The flow chart of FIG. 10 is predicated on a variable length output as discussed above with respect to FIG. 2. Accordingly, at a block 260, the Code Counter 223 is initialized to a first available code of, for example, 258. At a block 261, the Code Size register 221 is initialized to the beginning code size of 9 bits. At a block 262, the Dictionaries 230 and 240 and the Current Match register 213 are cleared to zero.

At a block 263, the first 4 input data characters are fetched to the Current Match register 213 to form a grouped character and at a block 264, the next 4 input data characters are fetched to the Current Character register 214 to form a grouped character.

Processing continues at a block 265 whereat the Dictionary 230 is searched to determine if the string comprising the current match concatenated by the current grouped character is in the Dictionary 230. As described above, the dictionary searching is performed associatively and other known dictionary searching procedures may be utilized to the same effect. Specifically, in the embodiment of FIG. 9, the Current Match register 213 is compared to the Prefix Code field 232 and the current grouped character in the Current Character register 214 is compared to the Grouped Character field 233.

If, at the block 265, the string is found in the Dictionary 230, the YES branch from the block 265 is taken to a block 266. At the block 266, the contents of the Current Match register 213 is updated to contain the code of the string that was found in the Dictionary 230. At block 266, therefore, the address 234 of the matched string is set into the Current Match register 213. After updating the Current Match register 213 with the currently matched string, control returns to the block 264 to fetch the next 4 input data characters to the Current Character register 214 to form the next input grouped character. In this manner, the loop formed by the blocks 264–266 compares the input data character stream with the strings stored in the Dictionary 230 to find the longest match with the stored strings which, as discussed above, comprise strings of consecutive grouped characters.

At the block 265, when the concatenation of the currently matched string in the Dictionary 230 with the next grouped character fetched at the block 264 results in a string that is not in the Dictionary 230, the NO branch from the block 265 is taken to a block 267. At the block 267, the Current Match Temp register 224 is cleared to zero and, at a block 268, the contents of the Current Match register 213 is set into the Current Match Temp register 224. At a block 269 the n-register 225 is set to 1.

Processing continues at a block 272 whereat the Dictionary 240 is searched to determine if the string comprising the current match concatenated by the $n^{th}$ data character in the Current Character register 214 is in the Dictionary 240. As described above, the dictionary searching is performed associatively and other known dictionary searching procedures may be utilized to the same effect. Specifically, when searching associatively, the contents of the Current Match register 213 is compared to the Prefix Code field 242 and the data character in the Current Character register 214 selected by the index n is compared to the Data Character field 243. Since the index n is set to 1 in the block 269, the comparison is first made utilizing the data character in the Data Character field 215.

If, at the block 272, the string is found in the Dictionary 240, the YES branch from the block 272 is taken to a block 273. At block 273 the contents of the Current Match register 213 is updated to contain the code of the string that was found. At block 273, therefore, the address 244 of the currently matched string is set into the Current Match register 213. Control then proceeds to a block 274 whereat the index n, in the n-register 225, is incremented by 1 and, at a block 275, the incremented index is tested to determine if it is greater than 3. If the index n is not greater than 3, the NO branch from the block 275 is taken back to the block 272 to determine if the string comprising current match concatenated by the data character in the Data Character field 216 (n=2) of the Current Character register 214 is in the Dictionary 240. In this manner, the loop formed by the blocks 272–275 extends the current match sequentially by the first, second and third data characters in the respective Data Character fields 215, 216 and 217 of the Current Character register 214 to determine if each extended string is in the Dictionary 240.

If, during the processing of the loop comprising the blocks 272–275, one of these extended strings is not in the Dictionary 240, the NO branch from the block 272 is taken to a block 280. At the block 280, the extended string that was not found in the Dictionary 240 at the block 272 is entered therein and the extant code of the Code Counter 223 is assigned to this stored extended string. The block 280 is implemented by storing the contents of the Current Match register 213 and the data character in the Current Character register 214 indexed by the n-register 225 in the Prefix Code field 242 and the Data Character field 243, respectively, of the location of the Dictionary 240 addressed by the Code Counter 223.

At a block 281, the code of the current match is output as part of the compressed code stream provided at the compressor output 212. The code of the current match is provided by the Current Match register 213. The code is output utilizing the number of bits denoted by the Code Size register 221.

It is appreciated by the operation of the compressor 210 that the code of the current match that is output at the block 281 can be of a grouped character having a value of from 0 to 255 or can be of an extended string having a code value of from 258 through 4095. Thereafter, at blocks 282–284, the Code Counter 223 and the Code Size register 221 are incremented in the manner described above with respect to the blocks 51–53 of FIG. 2.

Processing then proceeds to a block 285 whereat the Current Match register 213 is cleared to zero. At a block 286, the index in the n-register 225 is tested to determine if n is equal to 1. If n is equal to 1, the YES branch from the block 286 is taken to a block 287 whereat the Current Match register 213 is set to the contents of the Current Character register 214.

If, at the block 286, the index n is not equal to 1, the NO branch from the block 286 is taken to a block 288 whereat the next n−1 data characters are fetched to the Working Buffers 222. At a block 289, the Current Match register 213 is set to the $n^{th}$ through $4^{th}$ data characters of the Current Character register 214 concatenated with the n−1 fetched data characters in the Working Buffers 222 to form a grouped character. It is appreciated that at both the blocks 287 and 289, the Current Match register 213 is set with a grouped character with which to begin the next compression cycle. Accordingly, control returns from the block 287 or the block 289 to the block 264 to fetch the next 4 input data characters to the Current Character register 214 to form a grouped character.

If. at the block 275, the index n in the n-register 225 is greater than 3, the YES branch is taken from the block 275 to a block 300. At this point in the processing, the code in the Current Match register 213 represents a string in the Dictionary 240 that was successively extended and matched utilizing the data characters in the Data Character fields 215, 216 and 217 of the Current Character register 214. In effect, it was the data character in the Data Character field 218 of the Current Character register 214 that caused the mismatch at the block 265. It is now appropriate to extend the string in the Dictionary 230 represented by the code in the Current Match Temp register 224 by the grouped character residing in the Current Character register 214 and to store this string in the Dictionary 230.

Thus, at the block 300, this extended string is entered into the Dictionary 230 and the extant code of the Code Counter 223 is assigned to this stored extended string. The block 300 is implemented by storing the contents of the Current Match Temp register 224 and the contents of the Current Character register 214 in the Prefix Code field 232 and the Grouped Character field 233, respectively, of the location of the Dictionary 230 addressed by the Code Counter 223.

The operations of the blocks 301–305 parallel the operations described above with respect to the blocks 281–285. Briefly, the code of current match is output, the Code Counter and code size are appropriately incremented and the Current Match register 213 is cleared to zero.

At a block 306, the next 3 input data characters are fetched to the Working Buffers 222. At a block 307, the Current Match register 213 is set to the fourth data character in the Data Character field 218 of the Current Character register 214 concatenated with the 3 fetched data characters in the Working Buffers 222 to form a grouped character with which to begin the next compression cycle. Accordingly, control returns from the block 307 to the block 264 to fetch the next input grouped character to the Current Character register 214 as discussed above with respect to the blocks 287 and 289.

Referring to FIG. 11, with continued reference to FIGS. 9 and 10, an example of the operation of the compressor 210 in accordance with the flow chart of FIG. 10 is illustrated. The format of FIG. 11 is similar to that of FIG. 3 and descriptions given above with respect to FIG. 3 are applicable. As discussed above, an underlying data character alphabet of 4 characters, e.g., a, b, c and d, is assumed. The example input data character stream at the top of FIG. 11 utilizes the repetition of the characters a and b to exemplify the operations of the compressor 210.

In actions 1, 2, 4, 5, 7, 10, 14, 17, 21, 23, 26, 28, 35 and 40, the two consecutive grouped characters that initiate each respective string search is illustrated. In action 4, for example, the grouped character that is set into the Current Match register 213 at the end of the preceding cycle is "baba". The fetched grouped character in the Current Character register 214 is "baba". The string for which the compressor 210 is searching in Dictionary 1 is the concatenation of current match with current character, which, in action 4 is "baba baba". Since the string is not in Dictionary 1, block 272 determines if current match concatenated with the first data character of current character is in Dictionary 2. Since this string "baba b" is not yet in Dictionary 2, it is stored therein at code 260 and the code of the current match is output, namely, "baba". It is appreciated, as explained above, that the value of this code is less than 256. In this manner, the decompressor will recognize that it is receiving a grouped character and will extract the data characters therefrom.

Actions 7–9 depict the search for the string "abab abab" in Dictionary 1. Since this string is not yet in Dictionary 1, Dictionary 2 is searched for the string "abab a" which is found therein. Pursuant to the blocks 272–275 of FIG. 10, Dictionary 2 is then searched for the string "258 b" which is also found therein. Reiteration of the loop comprising blocks 272–275 then searches Dictionary 2 for the string "259a". Since this string is not yet in Dictionary 2, it is stored therein and the code 259 is output. Since this code is greater than 256, the decompressor will recognize that it is the code for an extended string and can access the characters thereof from the Decompressor Dictionary in a manner to be described.

Actions 10–13 depict a search similar to that described with respect to actions 7–9 except that the index n at the block 275 becomes greater than 3 and at action 13 the string "abab abab" is stored in Dictionary 1.

Actions 35–39 depict the operations of the flow chart of FIG. 10 whereby a string comprising 3 consecutive grouped characters is stored in Dictionary 1. As seen, this string is comprised of the grouped characters "abab abab abab".

Numerous of the string searches depicted in FIG. 11 result in Exception Case processing which will be described in greater detail with respect to the decompressor of FIG. 12. The string searches that result in the Exception Case processing are depicted by actions 2–3, 5–6, 10–13, 17–20, 23–25, 28–30 and 35–39. The Exception Case processing utilized herein is a modification of the Exception Case processing described in said U.S. Pat. No. 4,558,302.

More detailed descriptions of the actions of FIG. 11 relative to the blocks of FIG. 10 are readily apparent and will not be provided for brevity.

Figure 12:
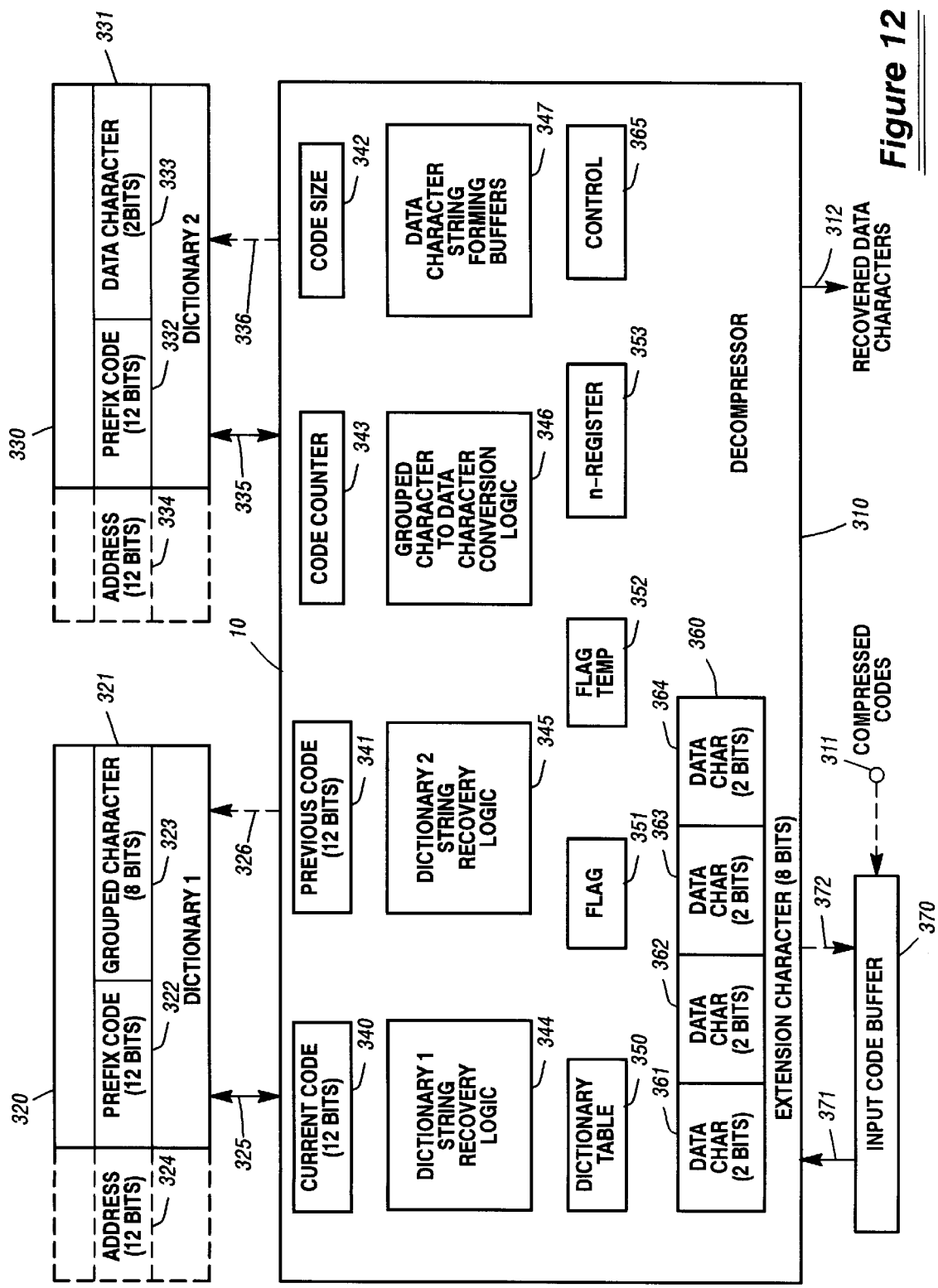
FIG. 12 is a schematic block diagram of a data decompressor embodied in accordance with the present invention for recovering data compressed by the compressor of FIG. 9.

FIGS. 12–20 depict a data decompressor of the alternative embodiment of the invention. Referring to FIG. 12, with continued reference to FIG. 9, a data decompressor 310 is illustrated that decompresses a stream of compressed codes applied at an input 311 into a recovered stream of data characters at an output 312. It is appreciated that the compressed code stream from the output 212 of the compressor 210 (FIG. 9), if applied to the input 311 of the decompressor 310, results. in the recovery, at the output 312 of the decompressor 310, of the original input data character stream applied to the input 211 of the compressor 210.

Dictionaries 320 and 330, denoted as Dictionary 1 and Dictionary 2, respectively, are included for storing data character strings corresponding to received compressed input codes. In the operation of the decompressor 310, the contents of the Dictionaries 320 and 330 are maintained identical to the contents of the respective Dictionaries 230 and 240 of the compressor 210 of FIG. 9. The Dictionaries 320 and 330 are preferably implemented by RAM and the data structures thereof are arranged in a manner similar to that described above with respect to the Dictionaries 230 and 240, respectively.

Accordingly, a location 321 of Dictionary 320 includes a 12 bit wide Prefix Code field 322 and an 8 bit wide Grouped Character field 323. The location 321 is accessed by a 12 bit wide address 324. In a manner similar to that described above with respect to the Dictionary 230, a string is stored in the Dictionary 320 by storing the string prefix code in the field 322 and the string extension grouped character in the field 323. The string code for the stored string at the location 321 is conveniently provided by the address 324. Data is communicated between the decompressor 310 and the Dictionary 320 via a bi-directional data bus 325 under control of a control bus 326.

A location 331 of the Dictionary 330 includes a 12 bit wide Prefix Code field 332 and a 2 bit wide Data Character field 333. The location 331 is accessed by a 12 bit wide address 334. In a manner similar to that described above with respect to the Dictionary 240, a string is stored in the Dictionary 330 by storing the string prefix code in the field 332 and the string extension data character in the field 333. The string code for the string stored at the location 331 is conveniently provided by the address 334. Data is communicated between the decompressor 310 and the Dictionary 330 via a bi-directional data bus 335 under control of a control bus 336.

In a manner similar to that described above with respect to FIG. 9, the Dictionary 320 stores strings that are comprised of consecutive grouped characters and the Dictionary 330 stores single data character extensions of the strings stored in the Dictionary 320.

The decompressor 310 includes a 12 bit wide Current Code register 340, a 12 bit wide Previous Code register 341 and a Code Size register 342. The Code Size register 342 performs a similar function to that described above with respect to the Code Size register 221 of the compressor 210 in that the Code Size register 342 determines the number of bits in which the decompressor 310 receives input compressed codes. The decompressor 310 further includes a Code Counter 343 for sequentially generating code values to be assigned to extended strings stored in the Dictionaries 320 and 330 by the decompressor 310. The codes are assigned so that a string stored either in the Dictionary 320 or the Dictionary 330 has a unique string code. The Code Counter 343 maintains a lock-step relationship with the Code Counter 223 of the compressor 210 of FIG. 9 as will be appreciated from the descriptions to follow.

The decompressor 310 further includes Dictionary 1 String Recovery logic 344 and Dictionary 2 String Recovery logic 345 for recovering strings stored in the respective Dictionaries 320 and 330 that are accessed by compressed codes. The general methodology for recovering data character strings from a dictionary in response to the string code corresponding thereto is known in the art of data compression and decompression (see, e.g., U.S. Pat. No. 4,558,302). The specific string recovery operations performed with respect to the grouped characters of the strings will be described below.

Since the Dictionary 320 stores strings comprising consecutive grouped characters and the Dictionary 330 stores single character extensions of the strings stored in the Dictionary 320, recovery of such a string involves access of both Dictionaries 320 and 330 in a manner to be described.

The decompressor 310 further includes Grouped Character to Data Character Conversion logic 346 that recovers, from a grouped character, the individual data characters comprising the grouped character. The decompressor 310 also includes Data Character String Forming buffers 347 that are utilized by the logic 344, 345 and 346 in assembling the data characters comprising a string recovered from the Dictionaries 320 and 330.

The decompressor 310 further includes a Dictionary Table 350 for listing the codes of the strings stored in Dictionary 1. The Dictionary Table 350 is used by the decompressor 310 to determine which Dictionary to access for a current input code or for a previous code when doing Exception Case processing.

The decompressor 310 also includes a Flag register 351 and a Flag Temp register 352. The decompressor 310 uses the registers 351 and 352 to determine which of Dictionary 1 or Dictionary 2 is appropriate for storing an extended string. The string recovered in a current cycle becomes the previous string in the next cycle. It is the previous string in the next cycle that is extended and stored. Thus, in a current cycle, the decompressor 310 determines from the characteristics of the current recovered string, the appropriate Dictionary for storing this string when extended in the next cycle. A flag indicating the Dictionary in which the string should be stored is set into the Flag Temp register 352. At the end of a decompression cycle, the flag in the Flag Temp register 352 is transferred to the Flag register 351. During the string storage portion of the decompression cycle, the decompressor 310 consults the Flag register 351 to determine the Dictionary into which to store the extended string.

The decompressor 310 further includes an n-register 353. One of the criteria utilized by the decompressor 310 to determine whether to store the Dictionary 1 flag or the Dictionary 2 flag in the Flag Temp register 352 is the number of data characters following the root code of a string accessed in Dictionary 2. This number of data characters is denoted by the variable n which is held in the n-register 353.

The decompressor 310 also includes an 8 bit wide Extension Character register 360 comprised of contiguous 2 bit wide Data Character fields 361–364. The Extension Character register 360 is utilized by the decompressor 310 for providing the extension grouped character for the Grouped Character field 323 of the Dictionary 320 when storing an extended string in the Dictionary 320. Further included in the decompressor 310 is control 365 for controlling the operations of the decompressor 310 in accordance with the operational flow charts of FIGS. 13–19 in a manner to be described.

Included with the decompressor 310 is an Input Code Buffer 370 that buffers the input compressed codes received at the input 311. The individual input codes are applied from the Input Code Buffer 370, via a bus 371, to the Current Code register 340 in accordance with operations to be described. The decompressor 310 controls acquiring input codes from the Input Code Buffer 370 via a control bus 372.

Briefly, the operation of the decompressor 310 is as follows. A code is fetched to the Current Code register 340 utilizing the number of bits determined by the code size in Code Size register 342. The fetched code is examined to determine if it is less than 256. If current code is less than 256, the input code comprises a grouped character transmitted by the compressor 210. The 4 data characters comprising the fetched grouped character in the Current Code register 340 are provided at the output 312 of the decompressor 310 as the recovered data characters of the string corresponding to current code. The Grouped Character To Data Character Conversion logic 346 and the Data Character String Forming buffers 347 are utilized in this string recovery process. Since the 4 data characters comprising the fetched grouped character are contiguous in the Current Code register 340, the recovered data characters are readily extracted from the register 340 by the logic 346 and placed in the buffers 347 for outputting. It is appreciated that access to the Dictionaries 320 and 330 are not required in this string recovery process.

The decompression cycle is concluded by appropriately updating either Dictionary 320 or 330, incrementing the Code Counter 343 and Code Size register 342 as required, and transferring current code from the register 340 to the Previous Code register 341.

If the code fetched to the Current Code register 340 is not less than 256 and is less than the code in the Code Counter 343, the string corresponding to current code exists in the Dictionaries 320 and 330. Current Code processing is utilized to recover the string by consulting the Dictionary Table 350 to determine if Current Code Dictionary 1 processing or Current Code Dictionary 2 processing should be utilized as will be described in detail below. Although the general methodology for recovering a string from a Dictionary is known as, for example, from said U.S. Pat. No. 4,558,302, numerous modifications thereof are utilized in accordance with the present invention, as described below, to perform the string recovery procedure.

The decompression cycle is then concluded as described above.

If the fetched input code in the Current Code register 340 is not less than the code in the Code Counter 343, Exception Case processing based on that described in said U.S. Pat. No. 4,558,302 is utilized. Briefly, the code in the Previous Code register 341 is utilized to access the previous string. The previous string is modified to recover the current string by extending the previous string by the first data character of the previous string. This extended string is then output as the current string and appropriately stored in the Dictionary 320 or the Dictionary 330. Different processing is utilized depending on whether the previous code is or is not less than 256 and whether the previous code is an entry in the Dictionary Table 350 as will be described below.

As above, the Code Counter 343 and Code Size register 342 are incremented as required and the current code is transferred from the register 340 to the Previous Code register 341.

The control flow charts of FIGS. 13–19 illustrate the detailed operations to be executed by the decompressor 310. The control 365 is considered as containing appropriate circuitry such as state machines to control execution of the operations.

Figure 13:
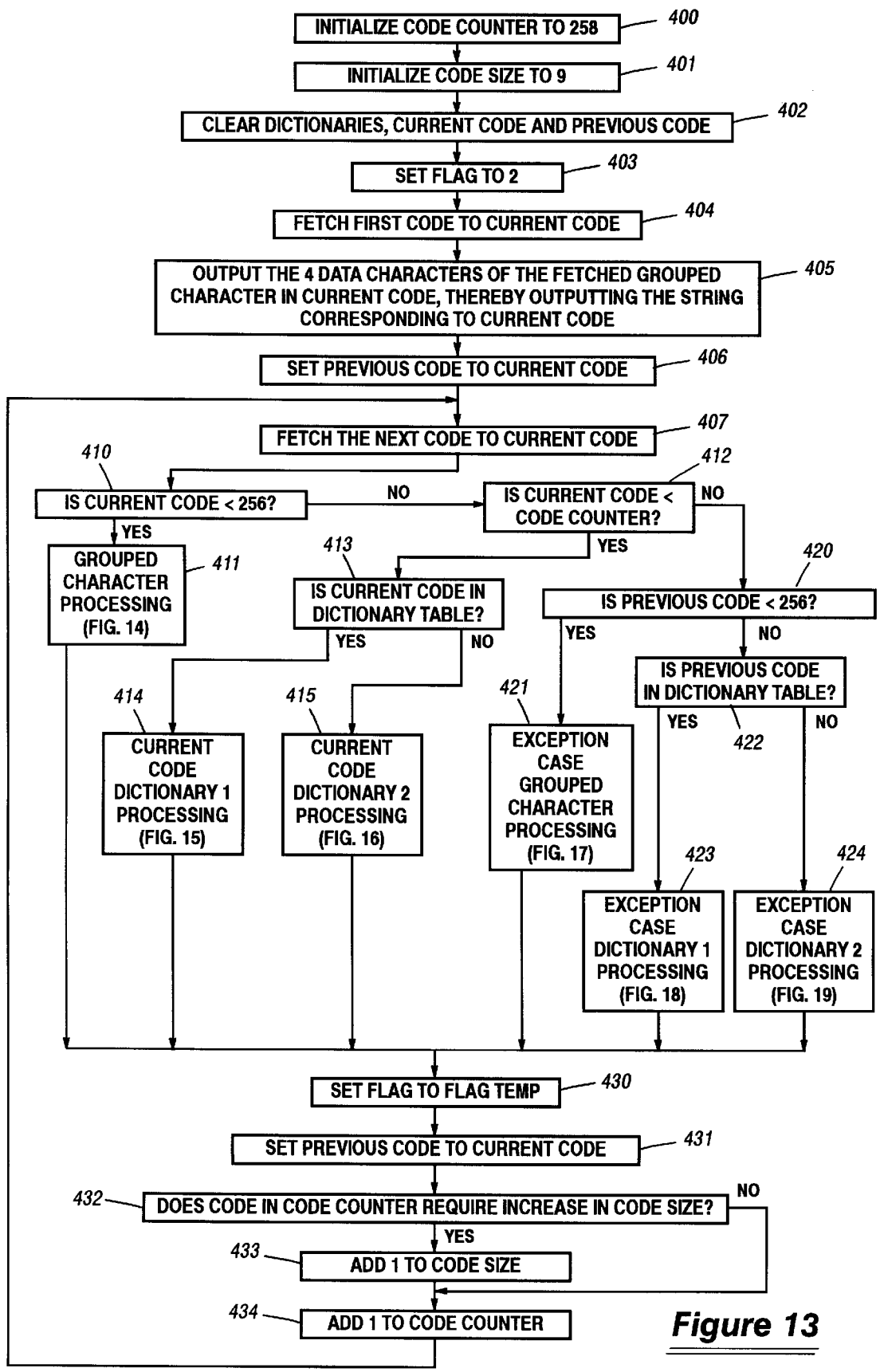
FIG. 13 is a control flow chart illustrating the operations executed by the decompressor of FIG. 12 so as to perform data decompression in accordance with the alternative embodiment of the present invention.

Referring to FIG. 13, with continued reference to FIG. 12, at a block 400, the Code Counter 343 is initialized in the same manner as described above with respect to the block 260 of FIG. 10. At a block 401, the Code Size register 342 is initialized to the beginning code size as explained above with respect to the block 261 of FIG. 10. At a block 402, the Dictionaries 320 and 330, the Current Code register 340 and the Previous Code register 341 are cleared to zero.

At a block 403, the Flag register 351 is set to 2 designating the Dictionary 330 (Dictionary 2). It is appreciated from the processing described above with respect to the compressor 210 that the first string to be stored in the Dictionaries will be stored in Dictionary 2.

At a block 404, the first input compressed code is fetched to the Current Code register 340 utilizing the number of bits determined by code size. Because of the above described operations of the compressor 210, the first fetched code is a grouped character. Accordingly, at a block 405, the 4 data characters of the fetched grouped character are provided at the output 312 of the decompressor 310. The 4 data characters are recovered from the Current Code register 340 in the manner described above. The 4 outputted data characters comprise the string corresponding to current code. At a block 406, the current code in the Current Code register 340 is transferred to the Previous Code register 341.

At a block 407, the next input compressed code is fetched to the Current Code register 340. The code fetched to the Current Code register 340 may represent either a grouped character or a longer extended string as discussed above. Such strings are distinguished from one another by the value of the code. A code representing a single grouped character has a value less than 256 while a code representing a longer string has a value that is not less than 256.

Accordingly, at a block 410, the code in the Current Code register 340 is tested to determine if current code is less than 256. If so, the YES branch is taken from the block 410 to a block 411 whereat Grouped Character processing is performed. The details of the processing of the block 411 will be described below with respect to FIG. 14.

If, at the block 410, current code is not less than 256, the NO branch from the block 410 is taken to a block 412 whereat the current code is tested against the code in the Code Counter 343. If current code in the Current Code register 340 is less than the code in the Code Counter 343, the YES branch from the block 412 is taken. When the YES branch from the block 412 is taken, current code processing is performed by accessing a string that exists in Dictionary 1 or Dictionary 2.

Accordingly, the YES branch from the block 412 enters a block 413 whereat the Dictionary Table 350 is consulted to determine if current code is listed therein. As discussed above, the Dictionary Table 350 lists the codes of the strings stored in Dictionary 1. Thus, if in the current code processing, Dictionary 1 should be accessed, the YES branch from the block 413 is take to a block 414. Details of the Current Code Dictionary 1 processing of block 414 will be described below with respect to FIG. 15. If, however, current code is not in the Dictionary Table 350, Dictionary 2 should be accessed and the NO branch from the block 413 is taken to a block 415. Details of the Current Code Dictionary 2 processing of block 415 will be described below with respect to FIG. 16.

If, at the block 412 current code is not less than the code in the Code Counter 343, the NO branch from the block 412 is taken. When the NO branch from the block 412 is taken, Exception Case processing is performed. It is appreciated that Exception Case processing will be invoked in the embodiment described herein when the received compressed code is equal to the code in the Code Counter 343.

When the compressed code fetched to the Current Code register 340 invokes the Exception Case processing, the Dictionaries 320 and 330 are not yet storing the string corresponding to current code. As above, the Exception Case processing involves utilizing the string corresponding to previous code for constructing, outputting and storing the string corresponding to current code.

Accordingly, processing proceeds from the NO branch of the block 412 to a block 420 whereat the previous code in the Previous Code register 341 is tested to determine if it is less than 256. If so, the string corresponding to previous code is a single grouped character and the YES branch from the block 420 is taken to a block 421 for performing Exception Case Grouped Character processing. Details of the Exception Case Grouped Character processing of block 421 will be described below with respect to FIG. 17.

If, at the block 420, previous code is not less than 256, the NO branch from the block 420 is taken to a block 422. When this occurs, access will be effected either to Dictionary 1 or Dictionary 2 as appropriate. Accordingly, at the block 422, the Dictionary Table 350 is consulted to determine which Dictionary to access. If previous code is listed in the Dictionary Table 350, the string corresponding to previous code is stored in Dictionary 1. The YES branch from the block 422 is therefore taken to a block 423 for performing Exception Case Dictionary 1 processing. The details of the Exception Case Dictionary 1 processing of block 423 will be described below with respect to FIG. 18.

If, at the block 422, previous code is not listed in the Dictionary Table 350, the NO branch from the block 422 is taken. When this occurs, the string corresponding to previous code is retrieved by accessing Dictionary 2. Thus, the NO branch from the block 422 is taken to a block 424 whereat Exception Case Dictionary 2 processing is performed. The details of the Exception Case Dictionary 2 processing of the block 424 will be described below with respect to FIG. 19.

It is appreciated that in each of the blocks 411, 414, 415, 421, 423 and 424, a string corresponding to current code is determined in the current decompression cycle. In accordance with the methodology utilized herein, the code of this string will become previous code in the next cycle and will be appropriately extended in the next cycle and stored in one of the Dictionaries 320 or 330. The Dictionary in which the extended string will be stored is determinable, in a manner to be described below, from the current code string. Thus, in each of the blocks 411, 414, 415, 421, 423 and 424, the appropriate Dictionary is determined for storing the extension of the current code string and the appropriate flag is stored in the Flag Temp register 352.

Accordingly, processing proceeds from each of blocks 411, 414, 415, 421, 423 and 424 to a block 430 at which the Flag register 351 is set to the value in the Flag Temp register 352. Thus, when the next cycle occurs, the Flag register 351 is consulted to determine in which of the Dictionaries to store the extended string. Additionally, in preparation for the next cycle, at a block 431, the Previous Code register 341 is set to the current code value in the Current Code register 340.

Processing proceeds to blocks 432–434 to perform updating of the Code Counter 343 and the Code Size register 342 in the manner described above with respect to the blocks 51–53 of FIG. 2. Control then returns to the block 407 to begin the next decompression cycle.

Figure 14:
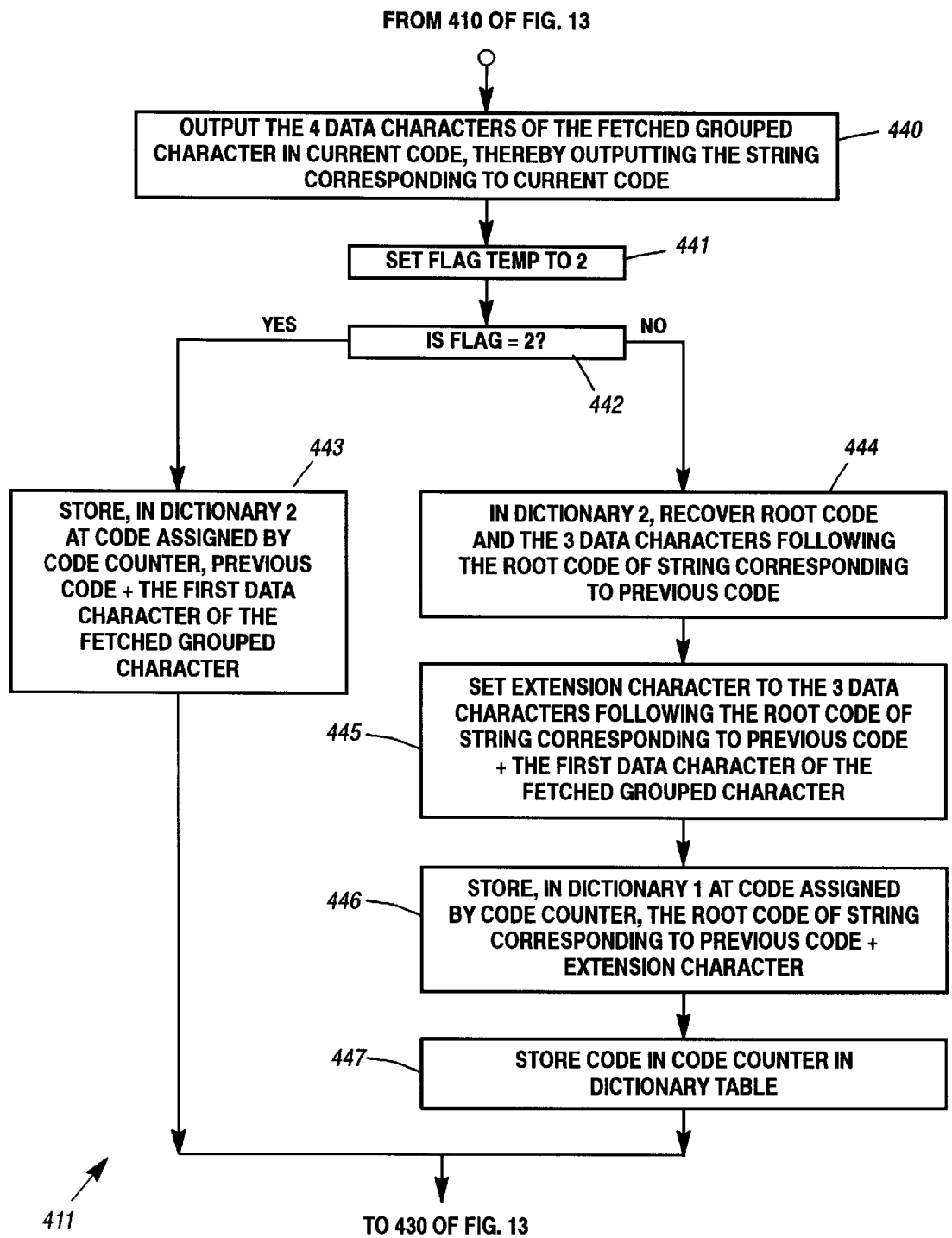
FIG. 14 is a control flow chart illustrating the Grouped Character processing logic utilized in the control flow chart of FIG. 13.

Referring to FIG. 14, with continued reference to FIGS. 12 and 13, details of the Grouped Character processing of the block 411 of FIG. 13 are illustrated. As discussed above, the processing 411 of FIG. 14 is invoked when the decompressor 310 receives an input compressed code that is less than 256. The input compressed code, therefore, is a single grouped character.

Accordingly, at a block 440, the 4 data characters of the fetched grouped character are provided at the output 312 of the decompressor 310 thereby outputting the string corresponding to current code. The block 440 is implemented utilizing the logic 346 and the buffers 347 to recover the 4 data characters from the Current Code register 340 in the manner described above.

Processing proceeds to a block 441 whereat the flag in the Flag Temp register 352 is set to 2. It is appreciated from the operations of FIG. 10 with respect to the compressor 210 that when a single grouped character is output as a longest match, it is extended and stored in Dictionary 2 of the compressor 210. Thus, in the decompressor 310, a received compressed code comprising a single grouped character is extended and stored in the decompressor Dictionary 2 in the next decompression cycle.

In order to determine in which Dictionary to store the extended string in the current decompression cycle, processing proceeds to a block 442 whereat the flag in the Flag register 351 is examined. If the flag in the Flag register 351 is equal to 2, the YES branch from the block 442 is taken to a block 443.

At the block 443, the Dictionary 330 is updated by storing therein an extended string comprising the previous code extended by the first data character of the fetched grouped character in the Current Code register 340. The extended string is stored in the Dictionary 330 at the code assigned by the Code Counter 343. The block 443 is implemented by storing previous code from the Previous Code register 341 and the first data character of the fetched grouped character in the Prefix Code field 332 and the Data Character field 333, respectively, of the location of the Dictionary 330 addressed by the Code Counter 343. The first data character of the fetched grouped character may be extracted either from the Current Code register 340 or from the buffers 347.

If, at the block 442, the flag in the Flag register 351 is set to 1, the NO branch from the block 442 is taken to store the appropriate extended string in Dictionary 1. It is appreciated from the operations described above with respect to FIGS. 9 and 10, that compressor Dictionary 1 is updated when a string is matched in compressor Dictionary 2 that comprises one or more sequential grouped characters followed by 3 extension data characters. Accordingly, the NO branch from the block 442 is taken to a block 444 at which, in Dictionary 330, the root code and the 3 data characters following the root code of the string corresponding to previous code is recovered. The string is recovered from the Dictionary 330 utilizing the logic 345 and the buffers 347 of the decompressor 310 of FIG. 12 generally utilizing the dictionary string recovering methodology described above.

Specifically, the Dictionary 330 is accessed by the previous code in the Previous Code register 341 and the data character in the Data Character field 333 of the accessed Dictionary location is transferred to the buffers 347. The code in the Prefix Code field 332 is utilized to again access the Dictionary 330 and the data character at the accessed location is again stored in the buffers 347. The process is repeated a third time and the 3 data characters following the root code of the string corresponding to previous code are now in the buffers 347. The root code of the string is now stored in the Prefix Code field 332 of the accessed location of the Dictionary 330. For convenience, the root code is transferred to the buffers 347.

At a block 445, the Extension Character register 360 is set to the 3 data characters extracted at the block 444 concatenated with the first data character of the fetched grouped character in the Current Code register 340. In a manner similar to that discussed above with respect to dictionary string recovery methodology, the 3 data characters are recovered from the Dictionary 330 in reverse order and the buffers 347 are utilized to provide these data characters in correct order. Control 365 extracts these 3 data characters from the buffers 347 and places them in the appropriate order in the Data Character fields 361–363 of the Extension Character register 360. Control 365 then extracts the first data character of the grouped character in the Current Character register 340 and places that data character into the Data Character field 364 of the Extension Character register 360.

Processing continues with the block 446 whereat the root code of the string corresponding to previous code concatenated with the contents of the Extension Character register 360 are stored in Dictionary 1 at the code assigned by the Code Counter 343. As described above with respect to the block 444, the root code of the string corresponding to previous code is now held in the buffers 347. The block 446 is implemented by storing this root code and the contents of the Extension Character register 360 in the Prefix Code field 322 and the Grouped Character field 323, respectively, of the location of the Dictionary 320 addressed by the Code Counter 343.

This extended string stored in the Dictionary 320 (Dictionary 1) is assigned the string code value of the extant code of the Code Counter 343. At a block 447, the extant code in the Code Counter 343 is listed in the Dictionary Table 350. In this manner, the Dictionary Table 350 maintains a list of the codes of the strings stored in Dictionary 1.

Processing continues from the block 443 and the block 447 to the block 430 of FIG. 13.

Figure 15:
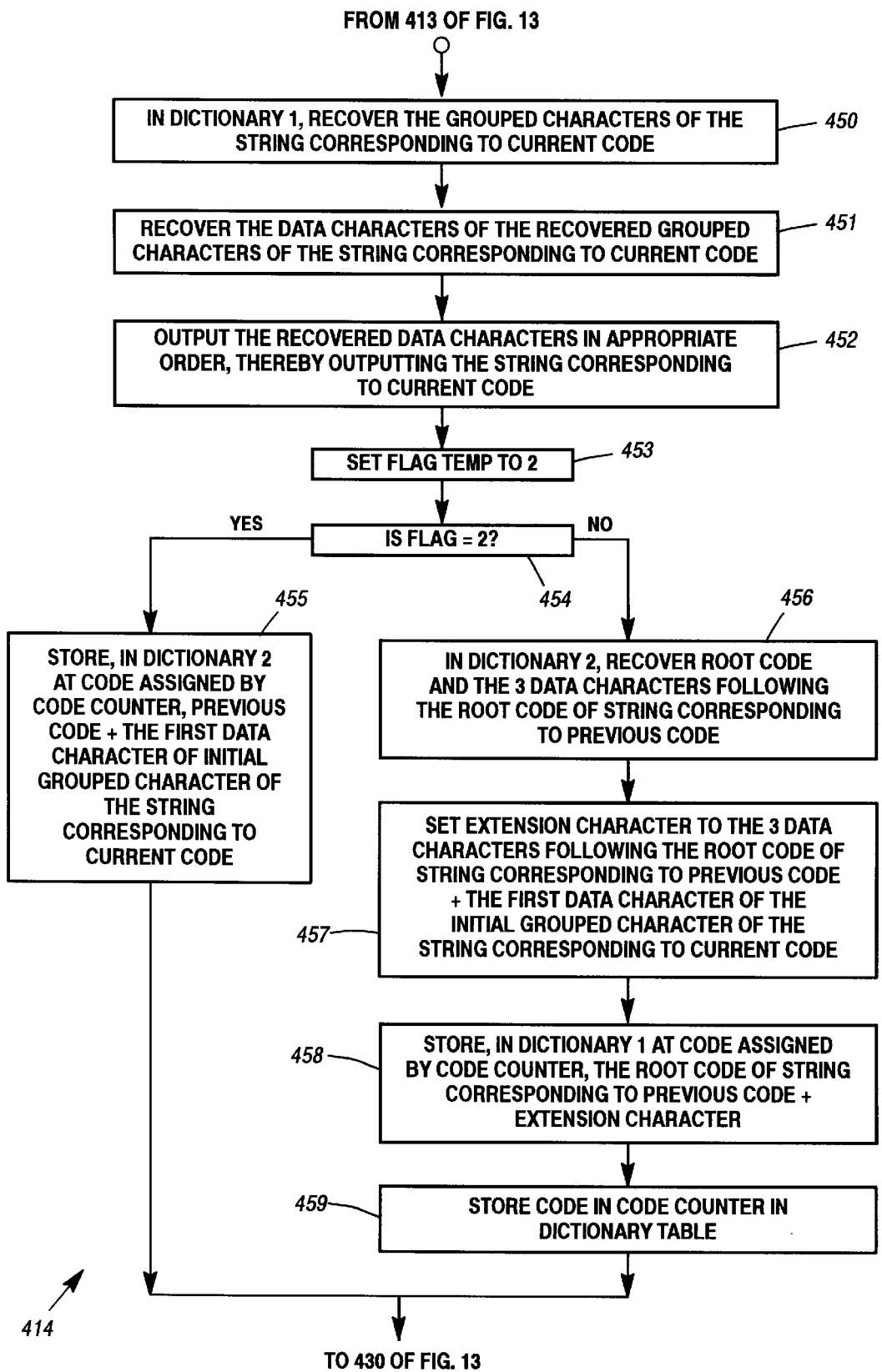
FIG. 15 is a control flow chart illustrating the Current Code Dictionary 1 processing logic utilized in the flow chart of FIG. 13.

Referring to FIG. 15, with continued reference to FIGS. 12 and 13, the details of the Current Code Dictionary 1 processing 414 of FIG. 13 are illustrated. It is appreciated that the processing 414 of FIG. 13 is invoked when the decompressor 310 receives an input compressed code that represents a string that is stored in the Dictionary 320 (Dictionary 1). In the present embodiment, the stored string is comprised of sequential grouped characters.

Accordingly, at a block 450, the grouped characters of the string corresponding to current code are recovered from Dictionary 1. Recovering the string from Dictionary 1 is performed generally in the manner described above with respect to dictionary string recovery methodology. The operations of block 450 are performed by the Dictionary 1 String Recovery logic 344 utilizing the Data Character String Forming buffers 347. Specifically, the Dictionary 320 is accessed by the fetched current code in the Current Code register 340 and the grouped character in the field 323 of the accessed Dictionary location is transferred to the buffers 347. The code in the field 322 is utilized to again access the Dictionary 320 and the grouped character at the accessed location is again stored in the buffers 347. This process continues until the code in the Prefix Code field 322 is less than 256. This prefix code in the field 322 comprises the initial grouped character of the string represented by current code. It is appreciated that the grouped characters of the string are recovered from the field 323 of the Dictionary 320 in reverse order. The buffers 347 are utilized to organize the grouped characters in the correct order.

Processing proceeds to a block 451 whereat the data characters of the recovered grouped characters of the string corresponding to current code are recovered. At a block 452, the recovered data characters are output from the decompressor 310 at the output 312 in appropriate order. The recovered outputted data characters comprise the string corresponding to current code. The operations of the blocks 451 and 452 are performed by the logic 346 and the buffers 347 under control of the logic 344. The 4 contiguous data characters of each recovered grouped character are readily recovered and transferred from the buffers 347 to the output 312 in the appropriate order.

At a block 453, the flag in the Flag Temp register 352 is set to 2. It is appreciated from the operations of the compressor 210 described with respect to FIGS. 9 and 10 that a longest matched string in Dictionary 1 will be extended by 1 data character and stored in Dictionary 2. Thus, the string corresponding to current code that was recovered from Dictionary 1 will be extended and stored in the next decompression cycle in Dictionary 2.

Processing proceeds to a block 454 whereat the flag in the Flag register 351 is consulted to determine in which Dictionary to store the extended string in the current decompression cycle. If the flag in the Flag register 351 is set to 2, the YES branch from the block 454 is taken to a block 455.

The processing of the block 455 is substantially the same as that described above with respect to the block 443 of FIG. 14. At the block 455, the previous code string is extended by the first data character of the initial grouped character of the string corresponding to current code. This data character is available in the buffers 347 pursuant to the processing described above with respect to the blocks 450–452.

If, at the block 454, the flag in the Flag register 351 denotes Dictionary 1, the NO branch from the block 454 is taken to blocks 456–459. The processing of the blocks 456–459 is substantially identical to that described above with respect to the blocks 444–447 of FIG. 14. It is appreciated, however, that at the block 457, the first data character of the initial grouped character of the string corresponding to current code is set into the Data Character field 364 of the Extension Character register 360. This data character is obtained from the buffers 347 as discussed above with respect to the block 455.

Processing continues from the blocks 455 and 459 to the block 430 of FIG. 13.

Figure 16:
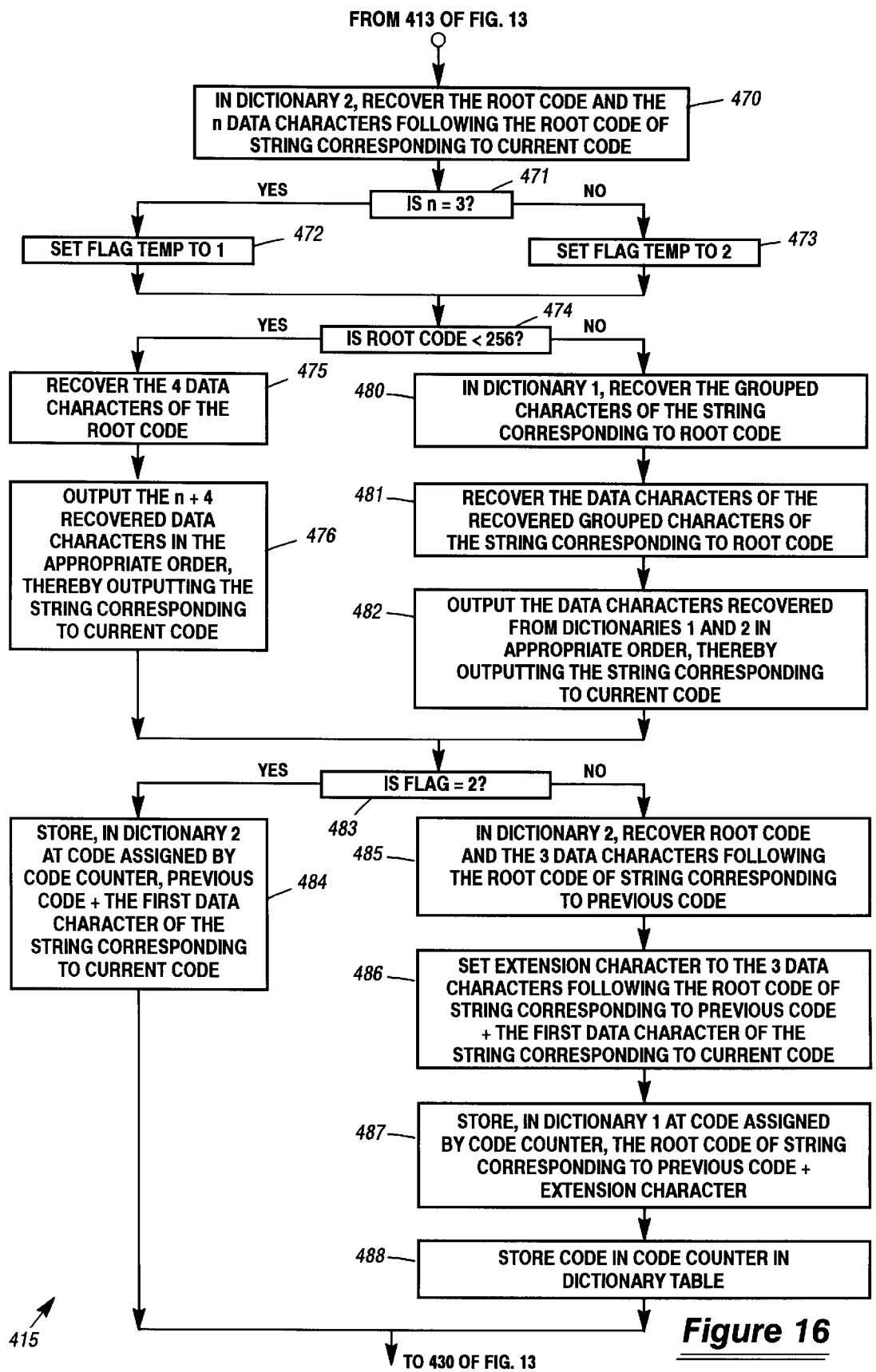
FIG. 16 is a control flow chart illustrating the Current Code Dictionary 2 processing logic utilized in the flow chart of FIG. 13.

Referring to FIG. 16, with continued reference to FIGS. 12 and 13, details of the Current Code Dictionary 2 processing of the block 415 of FIG. 13 are illustrated. It is appreciated that the processing 415 of FIG. 16 is invoked when the decompressor 310 receives an input compressed code that represents a string that is stored in the Dictionary 330 (Dictionary 2). In the present embodiment, the stored string is a 1, 2 or 3 data character extension of a single grouped character or of a multiple grouped character string stored in the Dictionary 320.

Accordingly, at a block 470, the root code and the n data characters following the root code of the string corresponding to current code are recovered from Dictionary 2. It is appreciated that the root code of the string will either be a grouped character having a value less than 256 or the code of a string in Dictionary 1 having a value of greater than 256. The Dictionary 2 String Recovery logic 345 and the Data Character String Forming buffers 347 are utilized in the processing of the block 470. Generally, the processing of the block 470 is performed in the manner described above with respect to dictionary string recovery methodology.

Specifically, the Dictionary 330 is accessed by the fetched current code in the Current Code register 340 and the data character in the Data Character field 333 of the accessed Dictionary location is transferred to the buffers 347. The prefix code in the field 332 is tested to determine if it is the root code of the string by first testing if it is less than 256. If not, the Dictionary Table 350 is consulted to determine if the prefix code is listed therein. If the prefix code is less than 256 or is in the Dictionary Table 350, the prefix code is the string root code. If not, the prefix code in the field 332 is utilized to again access the Dictionary 330 and the data character in the Data Character field 333 of the accessed location is again stored in the buffers 347. The process continues until the code in the Prefix Code field 332 is the string root code which is stored for convenience in the buffers 347.

It is appreciated that the data characters of the string are recovered from the field 333 in reverse order. The buffers 347 are utilized to provide the data characters in the correct order. As the data characters are recovered from the field 333 into the buffers 347, the number of recovered data characters are counted and the count stored in the n-register 353. It is appreciated in the present embodiment that n will be either 1, 2 or 3.

Processing proceeds to blocks 471–473 for setting the flag in the Flag Temp register 352 to determine the Dictionary into which to store the extended string in the next decompression cycle. Accordingly, at a block 471, the count n in the n-register 353 is tested to determine if n is equal to 3. If so, the YES branch from the block 471 is taken to the block 472 to set the Flag Temp register 352 to 1. If n is not equal to 3, the NO branch from the block 471 is taken to the block 473 to set the Flag Temp register 352 to 2.

At a block 474, the root code recovered at the block 470 is tested to determine if it is less than 256. If so, the YES branch is taken from the block 474 to a block 475. At the block 475, the 4 data characters comprising the root code are recovered. Since the root code resides in the buffers 347 pursuant to the processing of the block 470, the 4 contiguous data characters of this grouped character are readily recovered utilizing the logic 346 with the 4 data characters remaining in the buffers 347. At a block 476, the n+4 data characters recovered at the blocks 470 and 475 are output in the appropriate order at the output 312 of the decompressor 310. This recovered string of data characters comprises the string corresponding to current code in the Current Code register 340. It is appreciated that the logic 345 and 346 places the data characters in the buffers 347 in the appropriate order for outputting.

If, at the block 474, the root code is not less than 256, the NO branch from the block 474 is taken to a block 480. As discussed above with respect to the block 470, it is appreciated that if the NO branch from the block 474 is taken to the block 480, the root code is the code of a string in Dictionary 1. Accordingly, at the block 480, the grouped characters of the string corresponding to the root code are recovered from the Dictionary 320. The processing of the block 480 is the same as that described above with respect to the block 450 of FIG. 15 except that the string corresponding the root code is being recovered. Processing proceeds to a block 481 whereat the data characters of the recovered grouped characters of the string corresponding to root code are recovered. The processing of the block 481 is the same as that described above with respect to the block 451 of FIG. 15. At a block 482, the data characters recovered from Dictionaries 1 and 2 at the blocks 470 and 481 are output in appropriate order thereby outputting the string corresponding to current code. Control 365 extracts the data characters from the buffers 347 and provides them in the appropriate order at the output 312 of the decompressor 310.

Processing continues from the block 476 or the block 482 to a block 483 to determine the Dictionary in which to store the extended string in the current decompression cycle. Accordingly, at the block 483, the flag in the Flag register 351 is consulted to determine the Dictionary. If the flag is equal to 2, the YES branch from the block 483 is taken to a block 484 for updating the Dictionary 330. At the block 484, the string corresponding to previous code extended by the first data character of the string corresponding to current code is stored in Dictionary 2 and is assigned the string code value of the extant code of the Code Counter 343. The processing of the block 484 is similar to that described above with respect to the block 443 of FIG. 14 and the block 455 of FIG. 15. The block 484 is implemented by storing the previous code from the Previous Code register 341 and the first data character of the string corresponding to current code in the Prefix Code field 332 and the Data Character field 333, respectively, of the location of the Dictionary 330 addressed by the code counter 343. The first data character of the string corresponding to current code resides in the buffers 347.

If, at the block 483, the flag in the Flag register 351 is equal to 1, the NO branch from the block 483 is taken to blocks 485–488 for storing the appropriate extended string in Dictionary 1. The processing of the blocks 485–488 parallels the processing of blocks 444–447 of FIG. 14 and the blocks 456–459 of FIG. 15. At the block 486, however, the first data character of the string corresponding to current code is set into the Data Character field 364 of the Extension Character register 360. As discussed with respect to the block 484, this character resides in the buffers 347.

Processing continues from the block 484 and the block 488 to the block 430 of FIG. 13.

Figure 17:
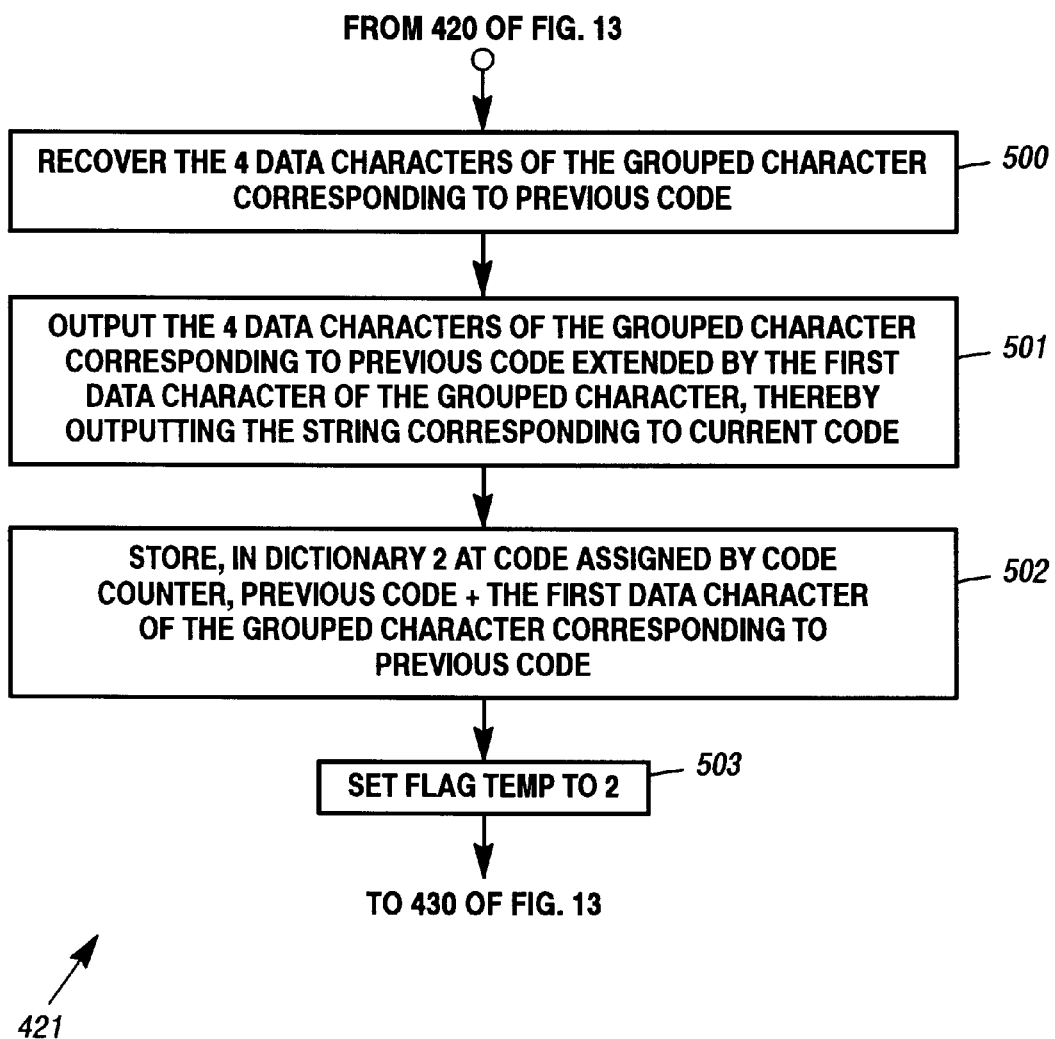
FIG. 17 is a control flow chart illustrating the Exception Case Grouped Character processing logic utilized in the flow chart of FIG. 13.

Referring to FIG. 17, with continued reference to FIGS. 12 and 13, details of the Exception Case Grouped Character processing of the block 421 of FIG. 13 are illustrated. As discussed above, the processing 421 of FIG. 17 is invoked when the decompressor 310 receives an input compressed code that is equal to the code in the Code Counter 343 and the previous code in the Previous Code register 341 is less than 256.

At a block 500, the 4 data characters of the grouped character corresponding to previous code are recovered. The 4 data characters are recovered by the logic 346 from the Previous Code register 341 and are stored in the buffers 347.

Processing proceeds to a block 501 whereat the 4 data characters of the grouped character corresponding to previous code extended by the first data character of this grouped character are output by the decompressor 310. This extended string is the string corresponding to the code just fetched to Current Code register 340. The logic 346 extends the 4 data characters held in the buffers 347 by the first data character thereof and control 365 then outputs these 5 data characters from the buffers 347 to the output 312.

Processing proceeds to a block 502 whereat the Dictionary 330 (Dictionary 2) is updated with an extended string comprising the string corresponding to previous code extended by the first data character of the grouped character corresponding to previous code. The string is stored in the Dictionary 330 at the string code assigned by the Code Counter 343. The function of block 502 is performed in a manner similar to that described above as follows. The code in the Previous Code register 341 is stored in the Prefix Code field 332 of the location of the Dictionary 330 accessed by the extant code in the Code Counter 343. The first data character of the grouped character corresponding to previous code is stored in the Data Character field 333 of the accessed Dictionary location. This is readily accomplished since this data character is stored in the buffers 347 as described above. Alternatively, this data character can be extracted from the Previous Code register 341 since it is part of the grouped character stored therein.

It is readily appreciated from the operations performed by the compressor 210 described above with respect to FIGS. 9 and 10 that, in the context of the processing 421 of FIG. 17, the extended string will always be stored in Dictionary 2.

At a block 503, the Flag Temp register 352 is set to 2. It is appreciated that the string created at the block 501, when extended in the next decompression cycle, will always be stored in Dictionary 2. Processing then continues from the block 503 to the block 430 of FIG. 13.

It is appreciated with respect to the processing of FIG. 17 that Dictionary accesses are not required to recover the string corresponding to previous code.

Figure 18:
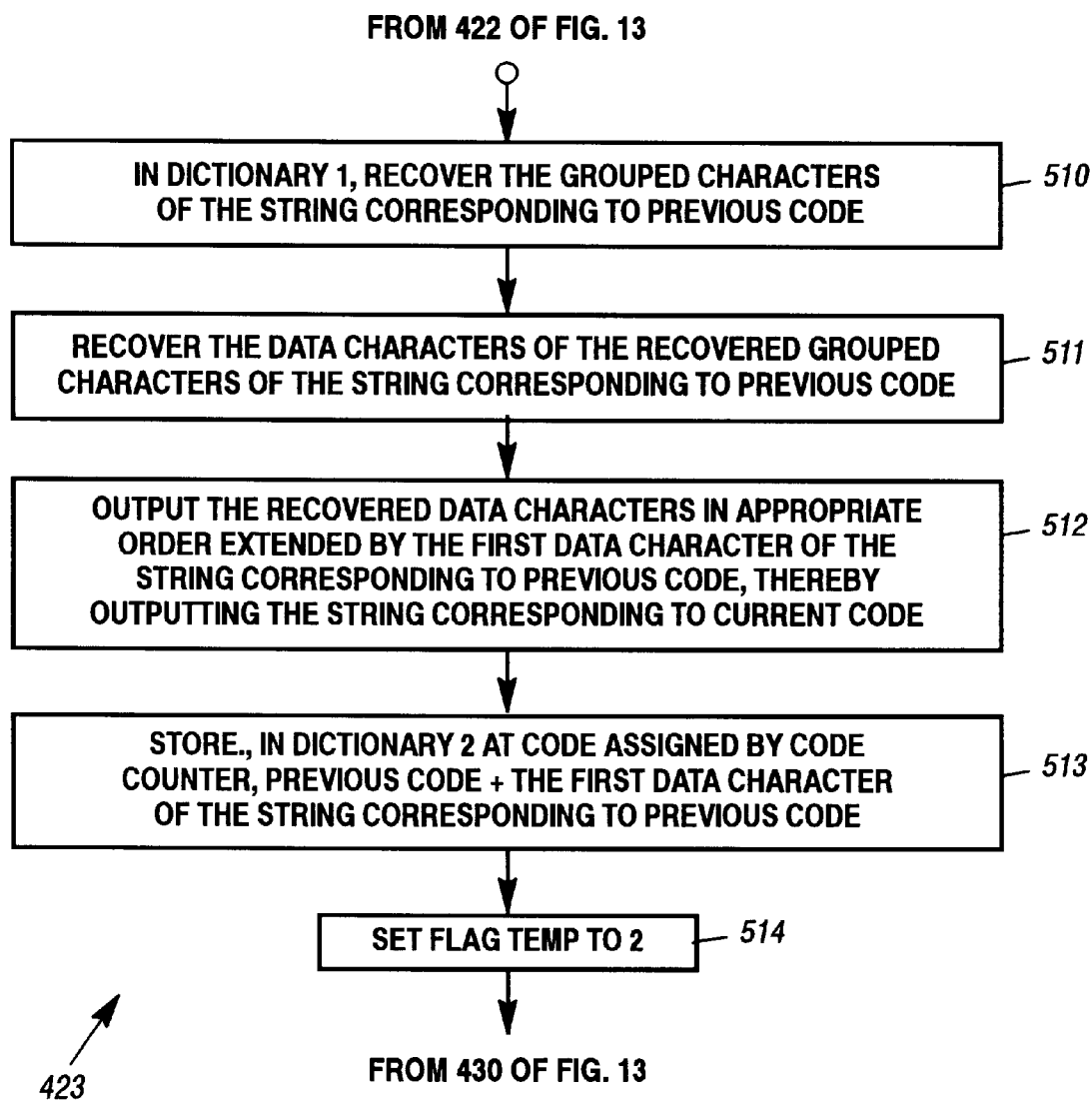
FIG. 18 is a control flow chart illustrating the Exception Case Dictionary 1 processing logic utilized in the flow chart of FIG. 13.

Referring to FIG. 18, with continued reference to FIGS. 12 and 13, details of the Exception Case Dictionary 1 processing 423 of FIG. 13 are illustrated. It is appreciated that the processing 423 of FIG. 13 is invoked when the decompressor 310 receives an input compressed code that is equal to the code in the Code Counter 343 and the previous code in the Previous Code register 341 is listed in the Dictionary Table 350. Thus, the string corresponding to previous code is located in Dictionary 1.

Accordingly, at a block 510, the grouped characters of the string corresponding to previous code are recovered from Dictionary 1. At a block 511, the data characters of the recovered grouped characters of the string corresponding to previous code are recovered. At a block 512, the data characters comprising the string corresponding to previous code are extended by the first data character of the string corresponding to previous code and this extended string is output from the decompressor 310 at the output 312 in appropriate order. The recovered and extended data characters that are outputted comprise the string corresponding to current code.

The operations performed at the blocks 510–512 correspond substantially to the operations described above with respect to the blocks 450–452 of FIG. 15. At the blocks 510–512, the processing is performed with respect to the previous code in the Previous Code register 341 rather than with respect to current code. Additionally, at the block 512, the string is extended by the first data character thereof. This string extension is readily performed in the buffers 347 since the data characters of the string corresponding to previous code recovered at the block 511 are held therein.

Processing proceeds to a block 513 whereat the Dictionary 330 is updated by storing therein an extended string comprising the string corresponding to previous code extended by the first data character thereof. The extended string is stored in the Dictionary 330 at the code assigned by the Code Counter 343. It is appreciated that the string stored at the block 513 is the string outputted at the block 512. The block 513 is implemented by storing previous code from the Previous Code register 341 and the first data character of the string corresponding to previous code in the Prefix Code field 332 and the Data Character field 333, respectively, of the location of the Dictionary 330 addressed by the Code Counter 343. The first data character of the string corresponding to previous code is extracted from the buffers 347.

Dictionary 2 is updated in the processing of FIG. 18 without consulting the Flag register 351, since the register 351 was set to 2 in the previous decompression cycle. This follows from the condition that in the processing of FIG. 18 previous code is recovered from Dictionary 1.

Processing proceeds to a block 514 whereat the Flag Temp register 352 is set to 2. The string corresponding to current code constructed at the block 512 will be extended in the next decompression cycle and stored in Dictionary 2. Processing continues from the block 514 to the block 430 of FIG. 13.

Figure 19:
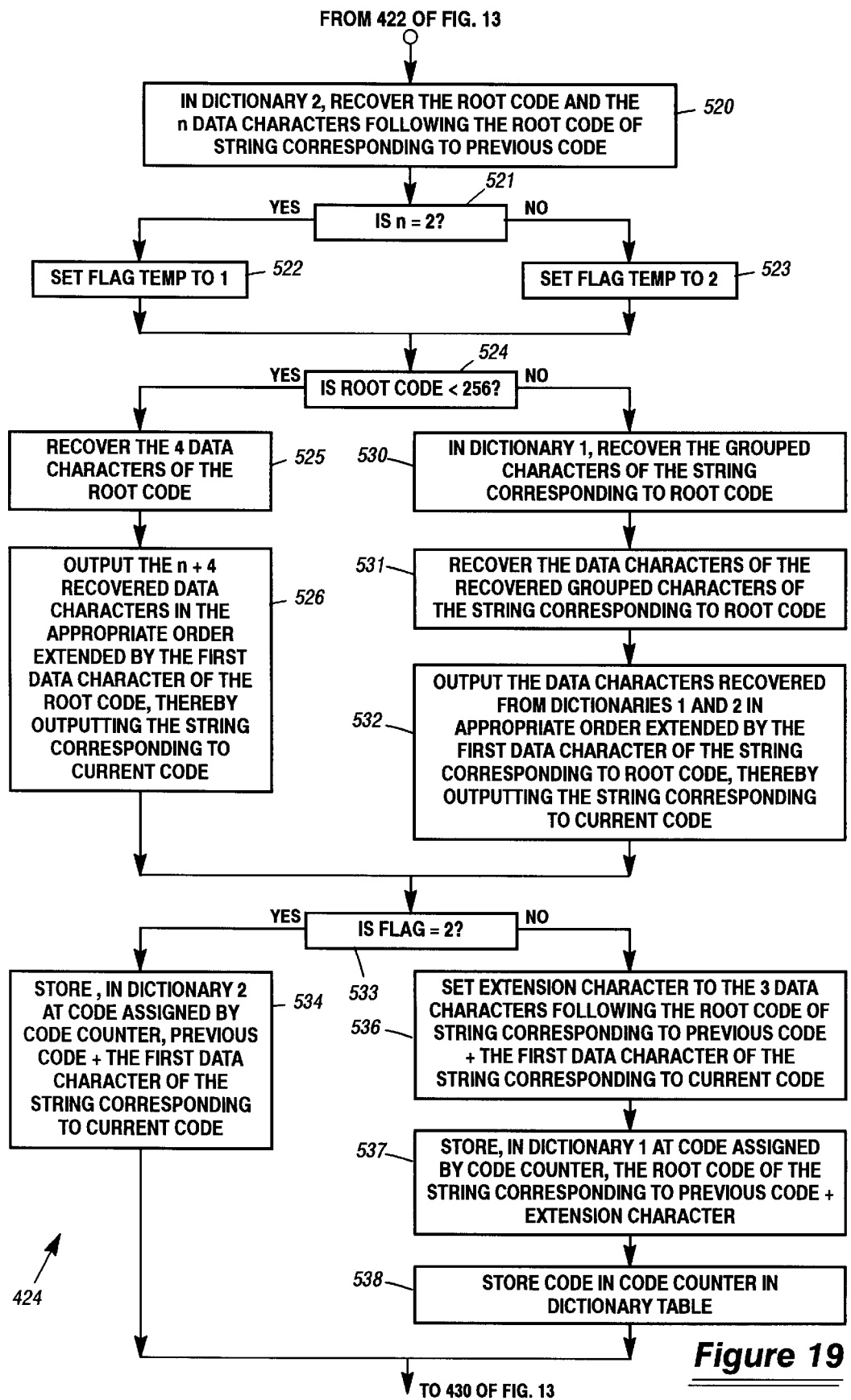
FIG. 19 is a control flow chart illustrating the Exception Case Dictionary 2 processing logic utilized in the flow chart of FIG. 13.

Referring to FIG. 19, with continued reference to FIGS. 12 and 13, details of the Exception Case Dictionary 2 processing of the block 424 of FIG. 13 are illustrated. It is appreciated that the processing 424 of FIG. 19 is invoked when the decompressor 310 received an input compressed code that is equal to the code in the Code Counter 343 and previous code in the Previous Code register 341 is not listed in the Dictionary Table 350. Thus, the string corresponding to previous code is located in Dictionary 2.

Accordingly, at a block 520, the root code and the n data characters following the root code of the string corresponding to previous code are recovered from Dictionary 2. The processing of the block 520 parallels that of the block 470 of FIG. 16 and the descriptions given above with respect thereto apply to the block 520. It is appreciated, however, that at the block 520 the Dictionary 330 is accessed by previous code in the Previous Code register 341 rather than current code in the Current Code register 340.

Processing proceeds to blocks 521–523 for setting the flag in the Flag Temp register 352 to determine the Dictionary into which to store the extended string in the next decompression cycle. The blocks 521–523 are similar to the blocks 471–473 of FIG. 16 except that in the block 521, the count n in the n-register 353 is tested to determine if n is equal to 2. The count of n=2 is appropriate in the Exception Case processing of FIG. 19 because the string corresponding to current code is recovered from the string corresponding to previous code by extending the previous code string by the first data character thereof. Thus, the Flag Temp register 352 is appropriately set at the blocks 522 and 523 so that in the next decompression cycle the appropriate Dictionary is updated.

At a block 524, the root code recovered at the block 520 is tested to determine if it is less than 256. If so, the YES branch is taken from the block 524 to a block 525. At the block 525, the 4 data characters comprising the root code are recovered. The operations of the block 525 are the same as those described above with respect to the block 475 of FIG. 16.

At a block 526, the n+4 data characters recovered at the blocks 520 and 525 are extended by the first data character of the root code recovered at the block 525. These n+5 characters are output in the appropriate order at the output 312 of the decompressor 310. This recovered string of data characters comprises the string corresponding to current code. The string is readily extended by the first data character of the root code since these data characters resides in the buffers 347. It is appreciated that the logic 345 and 346 places the data characters in the buffers 347 in the appropriate order for outputting.

If, at the block 524, the root code is not less than 256, the NO branch from the block 524 is taken to blocks 530 and 531. At the block 530, the grouped characters of the string corresponding to root code are recovered from Dictionary 1. At the block 531, the data characters of the recovered grouped characters of the string corresponding to root code are recovered. The operations of the blocks 530 and 531 parallel those of the blocks 480 and 481, respectively, of FIG. 16 and the descriptions given above with respect to the blocks 480 and 481 also apply to the blocks 530 and 531.

At a block 532, the string of data characters recovered from Dictionaries 1 and 2 at the blocks 520 and 531 is extended by the first data character of the string corresponding to root code. This is readily accomplished since all of the data characters involved reside in the buffers 347. The data characters of the extended string are output in appropriate order thereby outputting the string corresponding to current code. Control 365 extracts the data characters from the buffers 347 and provides them in the appropriate order at the output 312 of the decompressor 310.

Processing continues from the block 526 or the block 532 to blocks 533, 534 and 536–538. The processing of these blocks updates either the Dictionary 320 or the Dictionary 330 with an appropriate extended string. The operations of the blocks 533, 534 and 536–538 parallel those of the blocks 483, 484 and 486–488, respectively, of FIG. 16. The descriptions given above with respect to the blocks 483, 484 and 486–488 also apply to the blocks 533, 534 and 536–538, respectively. Processing continues from the block 534 and the block 538 to the block 430 of FIG. 13.

Referring to FIG. 20, with continued reference to FIGS. 12–19, an example of the operation of the compressor 310 in accordance with the flow charts of FIGS. 13–19 is illustrated. The format of FIG. 20 is generally similar to that of FIG. 11 and descriptions given above with respect to FIG. 11 are applicable. The Input Compressed Code Stream at the top of FIG. 20 is the compressor output illustrated in FIG. 11. It is observed that the output of FIG. 20 is the recovered data character stream illustrated at the top of FIG. 11.

It is noted that the first and third codes of the Input Compressed Code Stream at the top of FIG. 20 are grouped characters, namely "abab" and "baba". In actions 1 and 3, these grouped characters are processed by the denoted blocks of FIGS. 13 and 14 without the use of Dictionary string searching which otherwise would have been required in the prior art. Actions 5, 7, 9, 11, 13 and 15 exemplify the processing of the strings represented by input codes 259, 261, 263, 265, 267 and 269, respectively. The string processing of these actions utilize the Current Code processing of blocks 413–415 detailed in FIGS. 15 and 16.

Actions 2, 4, 6, 8, 10, 12 and 14 exemplify the processing of the strings represented by input codes 258, 260, 262, 264, 266, 268 and 270, respectively. The string processing of these actions utilize the Exception Case processing of blocks 420–424 detailed in FIGS. 17–19.

More detailed descriptions of the actions of FIG. 20 relative to the blocks of FIGS. 13–19 are readily apparent and will not be provided for brevity.

It is appreciated that in the compressor and decompressor embodiment of FIGS. 12–20, numerous Dictionary accesses are avoided compared to prior art implementations. For example, in FIG. 10, blocks 263, 264, 287, 289 and 307, 4 data characters are concatenated and processed as grouped characters thereby eliminating numerous compressor Dictionary accesses. Additionally, in FIG. 14, block 440 and FIG. 17, block 500, 4 data characters of grouped character inputs to the decompressor are recovered without accessing the Dictionary. Furthermore, in FIG. 15, block 451; FIG. 16, blocks 475 and 481; FIG. 18, block 511 and FIG. 19, blocks 525 and 531, each grouped character of a string is processed to provide 4 data characters of the string which otherwise would have required four separate Dictionary accesses.

A procedure is described above with respect to the decompressor of FIGS. 12–20 for recovering the root code and the data characters following root code from Dictionary 2 (e.g., FIG. 16, block 470). The process involves repetitively comparing the prefix code in the Prefix Code field 332 of the Dictionary 330 with 256 and repetitively determining if the prefix code is listed in the Dictionary Table 350. An alternative procedure may he effected as follows. At blocks 447, 459, 488 and 538 where the code in the Code Counter 343 is stored in the Dictionary Table 350, a unique "Dictionary 1 marker" is also stored in Dictionary 2 at the location addressed by the code in the Code Counter 343. It would then only he necessary to repetitively compare the prefix code in the Prefix Code field 332 to 256. The root code is determined either when the prefix code in the Prefix Code field 332 is less than 256 or when the prefix code accesses a location in Dictionary 2 storing the unique "Dictionary 1 marker".

The above embodiments were described in terms of an alphabet comprising 4 data characters and a grouped character of 4 consecutive data characters. Modifications to the embodiments to accommodate alphabet and grouped character sizes will be readily apparent to those skilled in the art.

While the invention has been described in its preferred embodiments, it is to be understood that the words which have been used are words of description rather than of limitation and that changes may be made within the purview of the appended claims without departing from the true scope and spirit of the invention in its broader aspects.

What is claimed is:

1. A data compression method for compressing an input stream of data characters into an output stream of compressed codes comprising storing strings of data characters encountered in said input stream, said stored strings having respective codes associated therewith, a string being stored as a grouping of a predetermined number of data characters concatenated with at least one data character, said grouping of said predetermined number of data characters defining a grouped character, in a compression cycle, forming said input stream into a grouped character comprised of said predetermined number of data characters followed by at least one data character, thereby providing a formed input stream, determining the longest match between said formed input stream and said stored strings by comparing said formed input stream to said stored strings by matching said grouped character of said formed input stream with said grouped character of said stored strings and sequentially matching said at least one data character of said formed input stream with said at least one data character of said stored strings until one of the data characters of said formed input stream causes a mismatch to occur, outputting the code associated with said longest match so as to provide said output stream of compressed codes, storing an extended string comprising said longest match extended by said data character that caused said mismatch, and assigning a code corresponding to said stored extended string, said step of forming said input stream including forming a new grouped character to begin the next compression cycle, said new grouped character comprising said data character that caused said mismatch concatenated by one less than said predetermined number of the next following data characters from said input stream.

2. The method of claim 1 wherein a stored string comprises an initial grouped character comprised of said predetermined number of data characters concatenated with a number of data characters, said forming step comprising forming said input stream into an initial grouped character comprised of said predetermined number of data characters followed by a number of data characters from said input stream, said determining step comprising matching said initial grouped character of said formed input stream with said initial grouped character of said stored strings and sequentially matching said number of data characters of said formed input stream with said number of data characters of said stored strings, said number of data characters increasing until one of the data characters causes said mismatch to occur.

3. The method of claim 1 wherein said step of forming said input stream includes forming said new grouped character and fetching following data characters from said input stream until the data character that causes said mismatch is fetched.

4. The method of claim 1 further including forming an initializing grouped character prior to initiating operations of said method, said initializing grouped character comprising said predetermined number of the first data characters of said input stream.

5. The method of claim 1 wherein each said grouped character has a code associated therewith, said code assigned to said stored extended string being greater than any code associated with said grouped characters.

6. The method of claim 1 wherein said data characters of said input stream are from an alphabet of characters comprising 4 data characters and said predetermined number comprises 4 consecutive data characters of said input stream.

7. A data compression method for compressing an input stream of data characters into an output stream of compressed codes comprising storing strings of data characters encountered in said input stream, said stored strings having respective codes associated therewith, a string being stored as at least one grouping of a predetermined number of data characters concatenated with at most one less than said predetermined number of data characters, said grouping of said predetermined number of data characters defining a grouped character, in a compression cycle, forming said input stream into a plurality of consecutive grouped characters, each grouped character comprised of said predetermined number of data characters, thereby providing a formed input stream, determining the longest match between said formed input stream and said stored strings by comparing said formed input stream to said stored strings by sequentially matching said plurality of consecutive grouped characters of said formed input stream with said at least one grouped character of said stored strings until a mismatching grouped character of said formed input stream occurs, and then sequentially matching the data characters of said mismatching grouped character with said concatenated data characters of said stored strings until said longest match is determined, outputting the code associated with said longest match so as to provide said output stream of compressed codes, storing an extended string comprising said longest match extended hy the data character of said mismatching grouped character following said longest match, and assigning a code corresponding to said stored extended string, said step of forming said input stream including forming a new grouped character to begin the next compression cycle, said new grouped character comprising the data characters of said mismatching grouped character following said longest match concatenated by a number of next following data characters from said input stream so that said new grouped character comprises said predetermined number of data characters.

8. The method of claim 7 wherein said step of storing strings comprises storing said strings of data characters in first and second storage means, a string being stored in said first storage means as a plurality of consecutive grouped characters, each grouped character comprised of said predetermined number of data characters, a string being stored in said second storage means as an extension of a string stored in said first storage means, said extension comprising at most one less than said predetermined number of data characters.

9. The method of claim 8 wherein said step of storing strings includes storing a string in said second storage means as a string comprising one grouped character extended by at most one less than said predetermined number of data characters.

10. The method of claim 9 wherein said determining step comprises comparing said formed input stream to said stored strings by sequentially matching said plurality of consecutive grouped characters of said formed input stream with said plurality of consecutive grouped characters of said strings stored in said first storage means until said mismatching grouped character of said formed input stream occurs, and then sequentially matching the data characters of said mismatching grouped character with the extension data characters of the strings stored in said second storage means until one of the data characters of said mismatching grouped character causes a mismatch to occur, thereby determining said longest match.

11. The method of claim 10 wherein said step of storing an extended string comprises storing, in said second storage means, an extended string comprising said longest match extended by said data character of said mismatching grouped character that caused said mismatch.

12. The method of claim 10 wherein said step of forming a new groused character comprises forming said new grouped character comprising the data characters of said mismatching grouped character beginning with and following said data character that caused said mismatch concatenated by a number of next following data characters from said input stream so that said new grouped character comprises said predetermined number of data characters.

13. The method of claim 12 wherein said new grouped character is equal to said mismatching groused character.

14. The method of claim 9 wherein said determining step comprises comparing said formed input stream to said stored strings by sequentially matching said plurality of consecutive grouped characters of said formed input stream with said plurality of consecutive grouped characters of said strings stored in said first storage means until said mismatching grouped character of said formed input stream occurs, thereby defining a longest matching string in said first storage means, and then sequentially matching the data characters of said mismatching groused character with the extension data characters of the strings stored in said second storage means until one less than said predetermined number of said extension data characters are matched, thereby determining said longest match.

15. The method of claim 14 wherein said step of storing an extended string comprises storing, in said first storage means, an extended string comprising said longest matching string in said first storage means extended by said mismatching grouped character.

16. The method of claim 14 wherein said step of forming a new grouped character comprises forming said new grouped character comprising the last data character of said mismatching grouped character concatenated by one less than said predetermined number of next following data characters from said input stream.

17. The method of claim 7 wherein each said grouped character has a code associated therewith, said code assigned to said stored extended string being greater than any code assigned to said grouped characters.

18. The method of claim 7 wherein said data characters of said input stream are from an alphabet of characters comprising 4 data characters and said predetermined number comprises 4 consecutive data characters of said input stream.

19. A data decompression method for decompressing an input stream of compressed codes to recover an output stream of data characters corresponding thereto comprising storing strings of data characters, said stored strings having respective codes associated therewith, a string being stored as a grouping of a predetermined number of data characters concatenated with at least one data character, said grouping of said predetermined number of data characters defining a grouped character, each said grouped character having associated therewith a code less than a predetermined code, each code associated with a stored string being greater than any code associated with a grouped character, in a decompression cycle, comparing a received compressed code to said predetermined code and if said received compressed code is less than said predetermined code, outputting the data characters of the grouped character corresponding to said received compressed code so as to provide said output stream of data characters, storing an extended string comprising the string corresponding to the compressed code received in the previous decompression cycle extended by the first data character of said grouped character corresponding to said received compressed code, said compressed code received in said previous decompression cycle defining a previous code, and assigning a code to said stored extended string, said code assigned to said stored extended string being greater than any code associated with said grouped characters.

20. The method of claim 19 wherein, if said received compressed code is not less than said predetermined code and said received compressed code corresponds to one of said stored strings, said method includes recovering said grouped character and said at least one data character of the stored string corresponding to said received compressed code, recovering the data characters of the recovered grouped character of said stored string corresponding to said received compressed code, outputting the recovered data characters so as to provide said output stream of data characters, storing an extended string comprising the string corresponding to said previous code extended hy the first data character of the recovered grouped character of said stored string corresponding to said received compressed code, and assigning a code to said stored extended string, said code assigned to said stored extended string being greater than any code associated with said grouped characters.

21. The method of claim 19 wherein, if said received compressed code is not less than said predetermined code and said received compressed code does not correspond to one of said stored strings, said method includes comparing said previous code to said predetermined code and if said previous code is less than said predetermined code, recovering the data characters of the grouped character corresponding to said previous code, outputting the data characters of said grouped character corresponding to said previous code extended by the first data character of said grouped character corresponding to said previous code so as to provide said output stream of data characters, storing an extended string comprising said grouped character corresponding to said previous code extended by the first data character of said grouped character corresponding to said previous code, and assigning a code to said stored extended string, said code assigned to said stored extended string being equal to said received compressed code.

22. The method of claim 19 wherein, if said received compressed code is not less than said predetermined code and said received compressed code does not correspond to one of said stored strings, said method includes comparing said previous code to said predetermined code and if said previous code is not less than said predetermined code, recovering said grouped character and said at least one data character of the stored string corresponding to said previous code, recovering the data characters of the recovered grouped character of said stored string corresponding to said previous code, outputting the recovered data characters extended by the first data character of said recovered grouped character of said stored string corresponding to said previous code so as to provide said output stream of data characters, storing an extended string comprising said stored string corresponding to said previous code extended by said first data character of said recovered grouped character of said stored string corresponding to said previous code, and assigning a code to said stored extended string, said code assigned to said stored extended string being equal to said received compressed code.

23. A data decompression method for decompressing an input stream of compressed codes to recover an output stream of data characters corresponding thereto comprising storing strings of data characters in first and second storage means, said stored strings having respective codes associated therewith, a string being stored in said first storage means as a plurality of consecutive groupings of data characters, each said grouping comprising a predetermined number of data characters, said grouping of said predetermined number of data characters defining a grouped character, each said grouped character having associated therewith a code less than a predetermined code, each code associated with a stored string being greater than any code associated with a grouped character, a string being stored in said second storage means as a root code extended by at most one less than said predetermined number of data characters, at least one of said strings stored in said second storage means being stored as an extension of a string stored in said first storage means wherein said root code comprises the code associated with said string stored in said first storage means, at least one of said strings stored in said second storage means being stored as one grouped character extended by at most one less than said predetermined number of data characters wherein said root code comprises said one grouped character, maintaining a table of the codes associated with strings stored in a particular one of said first and second storage means, in a decompression cycle, receiving a compressed code, outputting the data characters of a string of data characters corresponding to said received compressed code so as to provide said output stream of data characters, setting a temporary flag in accordance with said string corresponding to said received compressed code, said temporary flag indicating one of said first and second storage means into which to store an extended string in the next decompression cycle, storing an extended string in one of said first and second storage means in accordance with an update flag indicating into which of said first and second storage means to store said extended string, said extended string based on the string corresponding to the compressed code received in the previous decompression cycle, said compressed code received in said previous decompression cycle defining a previous code, assigning a code to said stored extended string, said code assigned to said stored extended string being greater than any code associated with said grouped characters, said maintaining step including listing said code assigned to said stored extended string in said table if said extended string is stored in said particular one of said first and second storage means, and transferring said temporary flag to said update flag.

24. The method of claim 23 wherein, in said decompression cycle, said method includes comparing said received compressed code to said predetermined code and if said received compressed code is less than said predetermined code said outputting step comprises outputting the data characters of the grouped character corresponding to said received compressed code, said setting step comprises setting said temporary flag to indicate said second storage means, if said update flag indicates said second storage means, said step of storing said extended string comprises storing said extended string in said second storage means, said extended string comprising the string corresponding to said previous code extended by the first data character of said grouped character corresponding to said received compressed code, and if said update flag indicates said first storage means, said step of storing an extended string comprises storing said extended string in said first storage means, said extended string comprising the root code of the string corresponding to said previous code extended by an extension grouped character, said extension grouped character comprising the data characters extending the root code of said string corresponding to said previous code concatenated by the first data character of said grouped character corresponding to said received compressed code.

25. The method of claim 23 wherein, in said decompression cycle, said method includes comparing said received compressed code to said predetermined code and if said received compressed code is not less than said predetermined code and said received compressed code corresponds to one of said stored strings, said method includes determining, from said table, in which of said first and second storage means the string corresponding to said received compressed code is stored and if said string corresponding to said received compressed code is stored in said first storage means, said method further includes recovering, from said first storage means, the grouped characters of said string corresponding to said received compressed code, recovering the data characters of the recovered grouped characters of said string corresponding to said received compressed code, said outputting step comprising outputting the recovered data characters, said setting step comprising setting said temporary flag to indicate said second storage means, if said update flag indicates said second storage means, said step of storing an extended string comprising storing said extended string in said second storage means, said extended string comprising the string corresponding to said previous code extended by the first data character of the initial grouped character of said string corresponding to said received compressed code, and if said update flag indicates said first storage means, said step of storing an extended string comprising storing said extended string in said first storage means, said extended string comprising the root code of the string corresponding to said previous code extended by an extension grouped character, said extension grouped character comprising the data characters extending said root code of said string corresponding to said previous code concatenated by said first data character of said initial grouped character of said string corresponding to said received compressed code.

26. The method of claim 23 wherein, in said decompression cycle, said method includes comparing said received compressed code to said predetermined code and if said received compressed code is not less than said predetermined code and said received compressed code corresponds to one of said stored strings, said method includes determining, from said table, in which of said first and second storage means the string corresponding to said received compressed code is stored and if said string corresponding to said received compressed code is stored in said second storage means, said method further includes recovering, from said second storage means, the root code and the n data characters extending the root code of said string corresponding to said received compressed code, if said recovered root code is less than said predetermined code, recovering the data characters of said recovered root code, said outputting step comprising outputting the recovered data characters of said recovered root code and said n data characters recovered from said string corresponding to said received compressed code, thereby outputting the data characters of said string corresponding to said received compressed code, if said recovered root code is not less than said predetermined code, recovering, from said first storage means, the grouped characters of the string corresponding to said recovered root code, recovering the data characters of the recovered grouped characters of said string corresponding to said recovered root code, said outputting step comprising outputting the data characters recovered from said grouped characters of said string corresponding to said recovered root code and outputting said n data characters recovered from said string corresponding to said received compressed code, thereby outputting the data characters of said string corresponding to said received compressed code, said setting step comprising setting said temporary flag to indicate said first storage means if n is equal to one less than said predetermined number of data characters, otherwise setting said temporary flag to indicate said second storage means, if said update flag indicates said second storage means, said step of storing an extended string comprising storing said extended string in said second storage means, said extended string comprising the string corresponding to said previous code extended by the first data character of said string corresponding to said received compressed code, and if said update flag indicates said first storage means, said step of storing an extended string comprising storing said extended string in said first storage means, said extended string comprising the root code of the string corresponding to said previous code extended by an extension grouped character, said extension grouped character comprising the data characters extending said root code of said string corresponding to said previous code concatenated by the first data character of said string corresponding to said received compressed code.

27. The method of claim 23 wherein, in said decompression cycle, said method includes comparing said received compressed code to said predetermined code and if said received compressed code is not less than said predetermined code and said received compressed code does not correspond to one of said stored strings, said method includes comparing said previous code to said predetermined code and if said previous code is less than said predetermined code said outputting step comprises outputting the data characters of the grouped character corresponding to said previous code extended by the first data character of said grouped character corresponding to said previous code, said setting step comprises setting said temporary flag to indicate said second storage means, and said step of storing an extended string comprises storing said extended string in said second storage means, said extended string comprising said grouped character corresponding to said previous code extended by the first data character of said grouped character corresponding to said previous code.

28. The method of claim 23 wherein, in said decompression cycle, said method includes comparing said received compressed code to said predetermined code and if said received compressed code is not less than said predetermined code and said received compressed code does not correspond to one of said stored strings, said method includes comparing said previous code to said predetermined code and if said previous code is not less than said predetermined code, said method further includes determining, from said table, in which of said first and second storage means the string corresponding to said previous code is stored and if said string corresponding to said previous code is stored in said first storage means, said method further includes recovering, from said first storage means, the grouped characters of the string corresponding to said previous code, recovering the data characters of the recovered grouped characters of said string corresponding to said previous code, said outputting step comprising outputting the recovered data characters extended by the first data character of said string corresponding to said previous code, said setting step comprising setting said temporary flag to indicate said second storage means, and said step of storing an extended string comprising storing said extended string in said second storage means, said extended string comprising said string corresponding to said previous code extended by said first data character of said string corresponding to said previous code.

29. The method of claim 23 wherein, in said decompression cycle, said method includes comparing said received compressed code to said predetermined code and if said received compressed code is not less than said predetermined code and said received compressed code does not correspond to one of said stored strings, said method includes comparing said previous code to said predetermined code and if said previous code is not less than said predetermined code, said method further includes determining, from said table, in which of said first and second storage means the string corresponding to said previous code is stored and if said string corresponding to said previous code is stored in said second storage means, said method further includes recovering, from said second storage means the root code and the n data characters extending the root code of said string corresponding to said previous code, if said recovered root code is less than said predetermined code, recovering the data characters of said recovered root code, said outputting step comprising outputting the recovered data characters of said recovered root code and said n data characters recovered from said string corresponding to said previous code extended by the first data character of said recovered root code, thereby outputting the data characters of the string corresponding to said received compressed code, if said recovered root code is not less than said predetermined code, recovering, from said first storage means, the grouped characters of the string corresponding to said recovered root code, recovering the data characters of the recovered grouped characters of said string corresponding to said recovered root code, said outputting step comprising outputting the data characters recovered from said grouped characters of said string corresponding to said recovered root code and outputting said n data characters recovered from said string corresponding to said previous code extended by the first data character of said string corresponding to said recovered root code, thereby outputting the data characters of the string corresponding to said received compressed code, said setting step comprising setting said temporary flag to indicate said first storage means if n is equal to two less than said predetermined number of data characters, otherwise setting said temporary flag to indicate said second storage means, if said update flag indicates said second storage means, said step of storing an extended string comprises storing said extended string in said second storage means, said extended string comprising said string corresponding to said previous code extended by the first data character of said string corresponding to said received compressed code, and if said update flag indicates said first storage means, said step of storing an extended string comprises storing said extended string in said first storage means, said extended string comprising said recovered root code of said string corresponding to said previous code extended by an extension grouped character, said extension grouped character comprising the data characters extending said root code of said string corresponding to said previous code concatenated by the first data character of said string corresponding to said received compressed code.

30. The method of claim 27, 28 or 29 wherein said assigning step includes assigning a code to said stored extended string, said code assigned to said stored extended string being equal to said received compressed code.

31. The method of claim 21, 22, 27, 28 or 29 wherein said assigning step comprises assigning said code to said stored extended string from a code counter that is incremented for each assigned code, further including comparing said received compressed code to the code in said code counter so as to determine if the string corresponding to said received compressed code is one of said stored strings.

32. Data compression apparatus for compressing an input stream of data characters into an output stream of compressed codes comprising means for storing strings of data characters encountered in said input stream, said stored strings having respective codes associated therewith, a string being stored as a grouping of a predetermined number of data characters concatenated with at least one data character, said grouping of said predetermined number of data characters defining a grouped character, means operative in a compression cycle for forming said input stream into a grouped character comprised of said predetermined number of data characters followed by at least one data character, thereby providing a formed input stream, means for determining the longest match between said formed input stream and said stored strings by comparing said formed input stream to said stored strings by matching said grouped character of said formed input stream with said grouped character of said stored strings and sequentially matching said at least one data character of said formed input stream with said at least one data character of said stored strings until one of the data characters of said formed input stream causes a mismatch to occur, means for outputting the code associated with said longest match so as to provide said output stream of compressed codes, means for storing an extended string comprising said longest match extended by said data character that caused said mismatch, and means for assigning a code corresponding to said stored extended string, said means for forming said input stream including means for forming a new grouped character to begin the next compression cycle, said new grouped character comprising said data character that caused said mismatch concatenated hy one less than said predetermined number of the next following data characters from said input stream.

33. The apparatus of claim 32 wherein a stored string comprises an initial grouped character comprised of said predetermined number of data characters concatenated with a number of data characters, said forming means including means for forming said input stream into an initial grouped character comprised of said predetermined number of data characters followed by a number of data characters from said input stream, said determining means comprising means for matching said initial grouped character of said formed input stream with said initial grouped character of said stored strings and sequentially matching said number of data characters of said formed input stream with said number of data characters of said stored strings, said number of data characters increasing until one of the data characters causes said mismatch to occur.

34. The apparatus of claim 32 wherein said means for forming said input stream includes means for forming said new grouped character and fetching following data characters from said input stream until the data character that causes said mismatch is fetched.

35. The apparatus of claim 32 further including means for forming an initializing grouped character prior to initiating operations of said apparatus, said initializing grouped character comprising said predetermined number of the first data characters of said input stream.

36. The apparatus of claim 32 wherein each said grouped character has a code associated therewith, said code assigned to said stored extended string being greater than any code associated with said grouped characters.

37. The apparatus of claim 32 wherein said data characters of said input stream are from an alphabet of characters comprising 4 data characters and said predetermined number comprises 4 consecutive data characters of said input stream.

38. Data compression apparatus for compressing an input stream of data characters into an output stream of compressed codes comprising means for storing strings of data characters encountered in said input stream, said stored strings having respective codes associated therewith, a string being stored as at least one grouping of a predetermined number of data characters concatenated with at most one less than said predetermined number of data characters, said grouping of said predetermined number of data characters defining a grouped character, means operative in a compression cycle for forming said input stream into a plurality of consecutive grouped characters, each grouped character comprised of said predetermined number of data characters, thereby Providing a formed input stream, means for determining the longest match between said formed input stream and said stored strings by comparing said formed input stream to said stored strings by sequentially matching said plurality of consecutive grouped characters of said formed input stream with said at least one grouped character of said stored strings until a mismatching grouped character of said formed input stream occurs, and then sequentially matching the data characters of said mismatching grouped character with said concatenated data characters of said stored strings until said longest match is determined, means for outputting the code associated with said longest match so as to provide said output stream of compressed codes, means for storing an extended string comprising said longest match extended by the data character of said mismatching grouped character following said longest match, and means for assigning a code corresponding to said stored extended string, said means for forming said input stream including means for forming a new grouped character to begin the next compression cycle, said new grouped character comprising the data characters of said mismatching grouped character following said longest match concatenated by a number of next following data characters from said input stream so that said new grouped character comprises said predetermined number of data characters.

39. The apparatus of claim 38 wherein said means for storing strings comprises means for storing said strings of data characters in first and second storage means, a string being stored in said first storage means as a plurality of consecutive grouped characters, each grouped character comprised of said predetermined number of data characters, a string being stored in said second storage means as an extension of a string stored in said first storage means, said extension comprising at most one less than said predetermined number of data characters.

40. The apparatus of claim 39 wherein said means for storing strings includes means for storing a string in said second storage means as a string comprising one grouped character extended by at most one less than said predetermined number of data characters.

41. The apparatus of claim 40 wherein said determining means comprises means for comparing said formed input stream to said stored strings by sequentially matching said plurality of consecutive grouped characters of said formed input stream with said plurality of consecutive grouped characters of said strings stored in said first storage means until said mismatching grouped character of said formed input stream occurs, and then sequentially matching the data characters of said mismatching grouped character with the extension data characters of the strings stored in said second storage means until one of the data characters of said mismatching grouped character causes a mismatch to occur, thereby determining said longest match.

42. The apparatus of claim 41 wherein said means for storing an extended string comprises means for storing, in said second storage means, an extended string comprising said longest match extended by said data character of said mismatching grouped character that caused said mismatch.

43. The apparatus of claim 41 wherein said means for forming a new grouped character comprises means for forming said new grouped character comprising the data characters of said mismatching grouped character beginning with and following said data character that caused said mismatch concatenated by a number of next following data characters from said input stream so that said new grouped character comprises said predetermined number of data characters.

44. The apparatus of claim 43 wherein said means for forming a new grouped character comprises means for forming said new grouped character equal to said mismatching grouped character.

45. The apparatus of claim 40 wherein said determining means comprises means for comparing said formed input stream to said stored strings by sequentially matching said plurality of consecutive grouped characters of said formed input stream with said plurality of consecutive grouped characters of said strings stored in said first storage means until said mismatching grouped character of said formed input stream occurs, thereby defining a longest matching string in said first storage means, and then sequentially matching the data characters of said mismatching grouped character with the extension data characters of the strings stored in said second storage means until one less than said predetermined number of said extension data characters are matched, thereby determining said longest match.

46. The apparatus of claim 45 wherein said means for storing an extended string comprises means for storing, in said first storage means, an extended string comprising said longest matching string in said first storage means extended by said mismatching grouped character.

47. The apparatus of claim 45 wherein said means for forming a new grouped character comprises means for forming said new grouped character comprising the last data character of said mismatching grouped character concatenated by one less than said predetermined number of next following data characters from said input stream.

48. The apparatus of claim 38 wherein each said grouped character has a code associated therewith, said code assigned to said stored extended string being greater than any code assigned to said grouped characters.

49. The apparatus of claim 38 wherein said data characters of said input stream are from an alphabet of characters comprising 4 data characters and said predetermined number comprises 4 consecutive data characters of said input stream.

50. Data decompression apparatus for decompressing an input stream of compressed codes to recover an output stream of data characters corresponding thereto comprising means for storing strings of data characters, said stored strings having respective codes associated therewith, a string being stored as a grouping of a predetermined number of data characters concatenated with at least one data character, said grouping of said predetermined number of data characters defining a grouped character, each said grouped character having associated therewith a code less than a predetermined code, each code associated with a stored string being greater than any code associated with a grouped character, said apparatus operative in a decompression cycle to comparing a received compressed code to said predetermined code and if said received compressed code is less than said predetermined code, to output the data characters of the grouped character corresponding to said received compressed code so as to provide said output stream of data characters, store an extended string comprising the string corresponding to the compressed code received in the previous decompression cycle extended by the first data character of said grouped character corresponding to said received compressed code, said compressed code received in said previous decompression cycle defining a previous code, and assign a code to said stored extended string, said code assigned to said stored extended string being greater than any code associated with said grouped characters.

51. The apparatus of claim 50 wherein, if said received compressed code is not less than said predetermined code and said received compressed code corresponds to one of said stored strings, said apparatus is operative to recover said grouped character and said at least one data character of the stored string corresponding to said received compressed code, recover the data characters of the recovered grouped character of said stored string corresponding to said received compressed code, output the recovered data characters so as to provide said output stream of data characters, store an extended string comprising the string corresponding to said previous code extended by the first data character of the recovered grouped character of said stored string corresponding to said received compressed code, and assign a code to said stored extended string, said code assigned to said stored extended string being greater than any code associated with said grouped characters.

52. The apparatus of claim 50 wherein, if said received compressed code is not less than said predetermined code and said received compressed code does not correspond to one of said stored strings, said apparatus is operative to compare said previous code to said predetermined code and if said previous code is less than said predetermined code, to recover the data characters of the grouped character corresponding to said previous code, output the data characters of said grouped character corresponding to said previous code extended by the first data character of said grouped character corresponding to said previous code so as to provide said output stream of data characters, store an extended string comprising said grouped character corresponding to said previous code extended by the first data character of said grouped character corresponding to said previous code, and assign a code to said stored extended string, said code assigned to said stored extended string being equal to said received compressed code.

53. The apparatus of claim 50 wherein, if said received compressed code is not less than said predetermined code and said received compressed code does not correspond to one of said stored strings, said apparatus is operative to compare said previous code to said predetermined code and if said previous code is not less than said predetermined code, recover said grouped character and said at least one data character of the stored string corresponding to said previous code, recover the data characters of the recovered grouped character of said stored string corresponding to said previous code, output the recovered data characters extended by the first data character of said recovered grouped character of said stored string corresponding to said previous code so as to provide said output stream of data characters, store an extended string comprising said stored string corresponding to said previous code extended by said first data character of said recovered grouped character of said stored string corresponding to said previous code, and assign a code to said stored extended string, said code assigned to said stored extended string being equal to said received compressed code.

54. Data decompression apparatus for decompressing an input stream of compressed codes to recover an output stream of data characters corresponding thereto comprising means for storing strings of data characters in first and second storage means, said stored strings having respective codes associated therewith, a string being stored in said first storage means as a plurality of consecutive groupings of data characters, each said grouping comprising a predetermined number of data characters, said grouping of said predetermined number of data characters defining a grouped character, each said grouped character having associated therewith a code less than a predetermined code, each code associated with a stored string being greater than any code associated with a grouped character, a string being stored in said second storage means as a root code extended by at most one less than said predetermined number of data characters, at least one of said strings stored in said second storage means being stored as an extension of a string stored in said first storage means wherein said root code comprises the code associated with said string stored in said first storage means, at least one of said strings stored in said second storage means being stored as one grouped character extended by at most one less than said predetermined number of data characters wherein said root code comprises said one grouped character, and a table listing the codes associated with strings stored in a particular one of said first and second storage means, said apparatus operative in a decompression cycle to receive a compressed code, output the data characters of a string of data characters corresponding to said received compressed code so as to provide said output stream of data characters, set a temporary flag in accordance with said string corresponding to said received compressed code, said temporary flag indicating one of said first and second storage means into which to store an extended string in the next decompression cycle, store an extended string in one of said first and second storage means in accordance with an update flag indicating into which of said first and second storage means to store said extended string, said extended string based on the string corresponding to the compressed code received in the previous decompression cycle, said compressed code received in said previous decompression cycle refining a previous code, assign a code to said stored extended string, said code assigned to said stored extended string being greater than any code associated with said grouped characters, list said code assigned to said stored extended string in said table if said extended string is stored in said particular one of said first and second storage means, and transfer said temporary flag to said update flag.

55. The apparatus of claim 54 wherein, in said decompression cycle, said apparatus is operative to compare said received compressed code to said predetermined code and if said received compressed code is less than said predetermined code, said apparatus is operative to output the data characters of the grouped character corresponding to said received compressed code, set said temporary flag to indicate said second storage means, if said update flag indicates said second storage means, store said extended string in said second storage means, said extended string comprising the string corresponding to said previous code extended by the first data character of said grouped character corresponding to said received compressed code, and if said update flag indicates said first storage means, store said extended string in said first storage means, said extended string comprising the root code of the string corresponding to said previous code extended by an extension grouped character, said extension grouped character comprising the data characters extending the root code of said string corresponding to said previous code concatenated hy the first data character of said grouped character corresponding to said received compressed code.

56. The apparatus of claim 54 wherein, in said decompression cycle, said apparatus is operative to compare said received compressed code to said predetermined code and if said received compressed code is not less than said predetermined code and said received compressed code corresponds to one of said stored strings, said apparatus is operative to determine, from said table, in which of said first and second storage means the string corresponding to said received compressed code is stored and if said string corresponding to said received compressed code is stored in said first storage means, said apparatus is further operative to recover, from said first storage means, the grouped characters of said string corresponding to said received compressed code, recover the data characters of the recovered grouped characters of said string corresponding to said received compressed code, output the recovered data characters, set said temporary flag to indicate said second storage means, if said update flag indicates said second storage means, store said extended string in said second storage means, said extended string comprising the string corresponding to said previous code extended by the first data character of the initial grouped character of said string corresponding to said received compressed code, and if said update flag indicates said first storage means, store said extended string in said first storage means, said extended string comprising the root code of the string corresponding to said previous code extended by an extension grouped character, said extension grouped character comprising the data characters extending said root code of said string corresponding to said previous code concatenated by said first data character of said initial groused character of said string corresponding to said received compressed code.

57. The apparatus of claim 54 wherein, in said decompression cycle, said apparatus is operative to compare said received compressed code to said predetermined code and if said received compressed code is not less than said predetermined code and said received compressed code corresponds to one of said stored strings, said apparatus is operative to determine, from said table, in which of said first and second storage means the string corresponding to said received compressed code is stored and if said string corresponding to said received compressed code is stored in said second storage means, said apparatus is further operative to recover, from said second storage means, the root code and the n data characters extending the root code of said string corresponding to said received compressed code, if said recovered root code is less than said predetermined code, recover the data characters of said recovered root code, output the recovered data characters of said recovered root code and said n data characters recovered from said string corresponding to said received compressed code, thereby outputting the data characters of said string corresponding to said received compressed code, if said recovered root code is not less than said predetermined code, recover, from said first storage means, the groused characters of the string corresponding to said recovered root code, recover the data characters of the recovered grouped characters of said string corresponding to said recovered root code, output the data characters recovered from said grouped characters of said string corresponding to said recovered root code and output said n data characters recovered from said string corresponding to said received compressed code, thereby outputting the data characters of said string corresponding to said received compressed code, set said temporary flag to indicate said first storage means if n is equal to one less than said predetermined number of data characters, otherwise set said temporary flag to indicate said second storage means, if said update flag indicates said second storage means, store said extended string in said second storage means, said extended string comprising the string corresponding to said previous code extended by the first data character of said string corresponding to said received compressed code, and if said update flag indicates said first storage means, store said extended string in said first storage means, said extended string comprising the root code of the string corresponding to said previous code extended by an extension grouped character, said extension grouped character comprising the data characters extending said root code of said string corresponding to said previous code concatenated by the first data character of said string corresponding to said received compressed code.

58. The apparatus of claim 54 wherein, in said decompression cycle, said apparatus is operative to compare said received compressed code to said predetermined code and if said received compressed code is not less than said predetermined code and said received compressed code does not correspond to one of said stored strings, said apparatus is operative to compare said previous code to said predetermined code and if said previous code is less than said predetermined code, said apparatus is further operative to output the data characters of the grouped character corresponding to said previous code extended by the first data character of said grouped character corresponding to said previous code, set said temporary flag to indicate said second storage means, and store said extended string in said second storage means, said extended string comprising said grouped character corresponding to said previous code extended by the first data character of said grouped character corresponding to said previous code.

59. The apparatus of claim 54 wherein, in said decompression cycle, said apparatus is operative to compare said received compressed code to said predetermined code and if said received compressed code is not less than said predetermined code and said received compressed code does not correspond to one of said stored strings, said apparatus is operative to compare said previous code to said predetermined code and if said previous code is not less than said predetermined code, said apparatus is further operative to determine, from said table, in which of said first and second storage means the string corresponding to said previous code is stored and if said string corresponding to said previous code is stored in said first storage means, said apparatus is further operative to recover, from said first storage means, the grouped characters of the string corresponding to said previous code, recover the data characters of the recovered grouped characters of said string corresponding to said previous code, output the recovered data characters extended by the first data character of said string corresponding to said previous code, set said temporary flag to indicate said second storage means, and store said extended string in said second storage means, said extended string comprising said string corresponding to said previous code extended by said first data character of said string corresponding to said previous code.

60. The apparatus of claim 54 wherein, in said decompression cycle, said apparatus is operative to compare said received compressed code to said predetermined code and if said received compressed code is not less than said predetermined code and said received compressed code does not correspond to one of said stored strings, said apparatus is operative to compare said previous code to said predetermined code and if said previous code is not less than said predetermined code, said apparatus is further operative to determine, from said table, in which of said first and second storage means the string corresponding to said previous code is stored and if said string corresponding to said previous code is stored in said second storage means, said apparatus is further operative to recover, from said second storage means the root code and the n data characters extending the root code of said string corresponding to said previous code, if said recovered root code is less than said predetermined code, recover the data characters of said recovered root code, output the recovered data characters of said recovered root code and said n data characters recovered from said string corresponding to said previous code extended by the first data character of said recovered root code, thereby outputting the data characters of the string corresponding to said received compressed code, if said recovered root code is not less than said predetermined code, recover, from said first storage means, the grouped characters of the string corresponding to said recovered root code, recover the data characters of the recovered grouped characters of said string corresponding to said recovered root code, output the data characters recovered from said grouped characters of said string corresponding to said recovered root code and output said n data characters recovered from said string corresponding to said previous code extended by the first data character of said string corresponding to said recovered root code, thereby outputting the data characters of the string corresponding to said received compressed code, set said temporary flag to indicate said first storage means if n is equal to two less than said predetermined number of data characters, otherwise set said temporary flag to indicate said second storage means, if said update flag indicates said second storage means, store said extended string in said second storage means, said extended string comprising said string corresponding to said previous code extended by the first data character of said string corresponding to said received compressed code, and if said update flag indicates said first storage means, store said extended string in said first storage means, said extended string comprising said recovered root code of said string corresponding to said previous code extended by an extension grouped character, said extension grouped character comprising the data characters extending said root code of said string corresponding to said previous code concatenated by the first data character of said string corresponding to said received compressed code.

61. The apparatus of claim 58, 59 or 60 further operative to assign a code to said stored extended string equal to said received compressed code.

62. The apparatus of claim 52, 53, 59, 59 or 60 further including a code counter for assigning said code to said stored extended. string, said code counter being incremented for each assigned code, and means for comparing said received compressed code to the code in said code counter so as to determine if the string corresponding to said received compressed code is one of said stored strings.

* * * * *